(12) United States Patent
Kawachi et al.

(10) Patent No.: US 9,400,095 B2
(45) Date of Patent: Jul. 26, 2016

(54) LIGHTING APPARATUS

(75) Inventors: Hideharu Kawachi, Hyogo (JP); Noboru Miyakawa, Gunma (JP); Hirofumi Konishi, Osaka (JP); Osamu Tanahashi, Kyoto (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 105 days.

(21) Appl. No.: 13/997,299

(22) PCT Filed: Dec. 8, 2011

(86) PCT No.: PCT/JP2011/078418
§ 371 (c)(1),
(2), (4) Date: Jun. 24, 2013

(87) PCT Pub. No.: WO2012/120739
PCT Pub. Date: Sep. 13, 2012

(65) Prior Publication Data
US 2013/0279181 A1  Oct. 24, 2013

(30) Foreign Application Priority Data

Mar. 4, 2011 (JP) ................................. 2011-048098
Mar. 4, 2011 (JP) ................................. 2011-048127

(51) Int. Cl.
*G09F 13/08* (2006.01)
*G09F 13/10* (2006.01)
(Continued)

(52) U.S. Cl.
CPC .......... *F21V 23/001* (2013.01); *H01L 51/5237* (2013.01); *F21Y 2105/008* (2013.01); *H01L 2251/5361* (2013.01)

(58) Field of Classification Search
CPC ................. H01L 2251/5361; H01L 27/3276; H01L 27/3288; H01L 51/5203; H01L 2924/00; F21V 23/001; F21V 23/00; F21V 15/01

USPC .......... 362/362, 372, 84, 632, 633, 634, 374, 362/375, 97.4
See application file for complete search history.

(56) References Cited

U.S. PATENT DOCUMENTS 7,633,747 B2 * 12/2009 Yang ..................... G06F 1/1626
345/173
2002/0015005 A1 * 2/2002 Imaeda ............... G02F 1/13452
345/5

(Continued)

FOREIGN PATENT DOCUMENTS

JP  08-315631 A  11/1996
JP  10-189239 A   7/1998

(Continued)

OTHER PUBLICATIONS

International Search Report for corresponding International Application No. PCT/JP2011/078418 mailed Mar. 6, 2012.

(Continued)

*Primary Examiner* — Evan Dzierzynski
*Assistant Examiner* — Tsion Tumebo
(74) *Attorney, Agent, or Firm* — Renner, Otto, Boisselle & Sklar, LLP

(57) ABSTRACT

A lighting apparatus includes: a light source unit that has a case storing therein a light-emitting panel and a wiring board mounted on a non-light emitting face thereof; and an attachment unit that has a housing storing therein a circuit board and configured to be detachably attached to the light source unit. The case has a wiring board storage. The housing has a circuit board storage. The case and the housing are arranged such that a whole of the wiring board storage and a whole of the circuit board storage are arranged at different positions in a direction perpendicular to an attachment direction of the light source unit and the attachment unit.

18 Claims, 13 Drawing Sheets

(51) Int. Cl.
  *F21V 23/00* (2015.01)
  *H01L 51/52* (2006.01)
  *F21Y 105/00* (2016.01)

(56) References Cited

U.S. PATENT DOCUMENTS

| | | | |
|---|---|---|---|
| 2006/0028790 A1* | 2/2006 | Baek | G02F 1/133308 361/679.21 |
| 2006/0087224 A1* | 4/2006 | Oki et al. | 313/504 |
| 2010/0259881 A1* | 10/2010 | Choi | G06F 1/1601 361/679.21 |
| 2011/0063265 A1* | 3/2011 | Kim | 345/205 |
| 2011/0187958 A1* | 8/2011 | Ogatsu | H04M 1/0202 349/58 |

FOREIGN PATENT DOCUMENTS

| | | |
|---|---|---|
| JP | 2007-149465 A | 6/2007 |
| JP | 2007-172918 A | 7/2007 |
| JP | 2007-172919 A | 7/2007 |
| JP | 2007-250302 A | 9/2007 |
| JP | 2008-258066 A | 10/2008 |
| JP | 2009-076388 A | 4/2009 |
| JP | 2009-129771 A | 6/2009 |

OTHER PUBLICATIONS

Form PCT/ISA/237 for corresponding International Application No. PCT/JP2011/078418 dated Mar. 6, 2012.

* cited by examiner

LIGHTING APPARATUS

TECHNICAL FIELD

The invention relates to a lighting apparatus comprising an EL device as a light source.

BACKGROUND ART

An electroluminescence (EL) device is formed by mounting a light-emitting part on a transparent substrate. The light-emitting part is formed by disposing a luminous layer between a positive electrode and a negative electrode. When a voltage is applied between the electrodes, the EL device emits light by excitons which are generated by recombination of electrons and holes as carriers injected into the luminous layer.

EL devices are generally classified into organic EL devices of which luminous layers are formed of organic compounds and inorganic EL devices of which luminous layers are formed of inorganic compounds. An organic EL device especially provides high-intensity lighting under a low voltage, and various luminescent colors according to a class of organic compounds. In addition, it is easy to perform production for a planar light-emitting panel, and therefore utilization for a light source of a lighting apparatus has been attracting the most attention in recent years.

In a light-emitting device with this sort of EL device, the module device is known in which a circuit board for performing lighting control of a light-emitting panel with an EL device is disposed beside the light-emitting panel (see, e.g., Japanese Patent Application Publication No. 10-189239 (hereinafter referred to as "Document 1")).

However, in the light-emitting device described in Document 1, since the circuit board is disposed beside the light-emitting panel, the light-emitting panel cannot be not disposed at a position of the circuit board, thereby causing a non-light emitting region (a region where no light is emitted). It is therefore impossible to assemble a lighting apparatus having a large lighting surface area when a plurality of modules is arranged side by side for example, because a distance between emitting regions of adjoining modules becomes longer. On the other hand, there is a concern that an advantage of a planar light-emitting panel is spoiled if the circuit board is mounted on a non-emitting surface side of the light-emitting panel, because a thickness of the module and a lighting apparatus with the same increases.

Incidentally, a light-emitting panel with an organic EL device has an emission lifetime caused by organic material degradation or the like. In a lighting apparatus with the light-emitting panel, replacement is required when the light-emitting panel reaches the end of its life or is damaged. It is therefore desirable that a lighting apparatus with a light-emitting panel employing an organic EL device as a light source be configured so that the light-emitting panel can be easily replaced. This sort of lighting apparatus is known in which a rail-shaped concavity is formed at a side of a body holding a light-emitting panel, and the light-emitting panel is engaged with the concavity and thereby the light-emitting panel is attached to the concavity while the apparatus is connected to a power supply portion provided in the concavity (see, e.g., Japanese Patent Application Publication No. 2007-172918 (hereinafter referred to as "Document 2")). In this lighting apparatus, the light-emitting panel can be attached to and detached from the concavity by sliding it vertically.

A lighting apparatus including an enclosure having a slot into which a light-emitting panel is inserted is known (see, for example, Japanese Patent Application Publication No. 2007-250302 (hereinafter referred to as "Document 3")). One end of the enclosure is supported by a hinge to be free to pivot and the other end of the enclosure is held, and thereby the enclosure and the light-emitting panel inserted thereinto are attached to the lighting apparatus. In this lighting apparatus, the light-emitting panel can be replaced with the enclosure pivoted.

SUMMARY OF INVENTION

The present invention has been achieved in view of the above circumstances, and an object thereof is to provide a lighting apparatus capable of increasing a light-emitting region in a light-emitting face side and having a thin thickness.

In order to solve the problem, the present invention (hereinafter referred to as a "first invention") is a lighting apparatus (1), comprising: a light source unit (2) that has a case (20) storing therein a planar light-emitting panel (5) and a wiring board (6) mounted on a non-light emitting face of the light-emitting panel (5); and an attachment unit (3) that has a housing (30) storing therein a circuit board (8) configured to control lighting of the light-emitting panel (5). The attachment unit (3) is configured to be attached to and detached from a back of the light source unit (2). A side of the case (20), facing the attachment unit (3) is shaped like a convex, at back side of which a concave wiring board storage (24) storing therein the wiring board (6) is formed. A side of the housing (30), facing the light source unit (2) is shaped like a convex. A concave circuit board storage (32) storing therein the circuit board (8) is formed at a back side of the housing. The case (20) of the light source unit (2) and the housing (30) of the attachment unit (3) are configured so that, in an attachment state of the back of the light source unit (2) to the attachment unit (3), a whole of the wiring board storage (24) and a whole of the circuit board storage (32) are arranged at different positions in a direction perpendicular to an attachment direction of the back of the light source unit (2) to the attachment unit (3), and the case (20) and the housing (30) are fitted into each other. The subject matter of the first invention can be applied to a second invention to be described.

In an embodiment, a recess (25) formed of part, which is different from the wiring board storage (24), of the case (20), and the circuit board storage (32) shaped like a convex in the side of the housing (30) facing the light source unit (2) are formed at positions corresponding to each other and engaged with each other by a tongue-and-groove joint.

In an embodiment, the wiring board (6) is shaped like a frame and the circuit board (8) is disposed at a center of the attachment unit (3) so as to correspond to a central opening of the frame-shaped wiring board (6).

In the present invention, both the wiring board and the circuit board are disposed in a side of the non-light emitting face of the light-emitting panel, and accordingly a light-emitting region in a side of a light emitting face thereof can be enlarged. The wiring board and the circuit board are disposed not to overlap with each other. The lighting apparatus can accordingly have a thinner thickness as compared with the case where they are disposed to overlap with each other.

The present invention (hereinafter referred to as a "second invention") is a lighting apparatus (1), comprising: a light source unit (2) having a planar light-emitting panel (5); and an attachment unit (3) configured to be detachably attached to the light source unit (2). An engaging part (21a) is provided at one end of a non-light emitting face of the light source unit (2). An engaged part (31a) configured to be engaged with the engaging part (21a) is provided in an attachment face, to which the light source unit (2) is attached, of the attachment unit (3). In a state that the engaging part (21a) engages with the engaged part (31a), the light source unit (2) is free to turn with respect to the attachment unit (3). An attaching part (21b) is provided at different part from one end, at which the engaging part (21a) is provided, of a non-light emitting face of the light source unit (2). An attached part (31b) at which the attaching part (21b) is configured to be retained is provided in the attachment face of the attachment unit (3). The subject matter of the second invention can be applied to the first invention.

In an embodiment, the attaching part (21b) and the attached part (31b) are provided at other side different from the engaging part (21a) and the engaged part (31a) with respect to a center plane passing through a center part of the light source unit (2). The center plane includes a normal line to said attachment face and a line parallel to a pivot axis around which the light source unit (2) is free to turn with respect to the attachment unit (3).

In an embodiment, the engaging part (21a) or the engaged part (31a) is free to slide in a direction substantially parallel to said attachment face and elastically biased in a direction from one end to center side thereof.

In an embodiment, the engaging part (21a) and the engaged part (31a) as well as the attaching part (21b) and the attached part (31b) are formed so that the engaging part (21a) and the engaged part (31a) are different, in width along a direction of said pivot axis, from the attaching part (21b) and the attached part (31b).

In an embodiment, the engaging part (21a) and the engaged part (31a) as well as the attaching part (21b) and the attached part (31b) are provided one pair each, and configured so that each interval of the pair of the engaging parts (21a) and the pair of the engaged parts (31a) differs from each interval of the pair of the attaching parts (21b) and the pair of the attached parts (31b).

In an embodiment, the light source unit (2) and the attachment unit (3) comprise respective power supply terminals (4, 81), and the power supply terminals are located at positions apart from the engaging part (21a) and the engaged part (31a).

In an embodiment, the attaching part (21b) and the attached part (31b) are configured to function as power supply terminals.

In an embodiment, the engaging part (21a) and the engaged part (31a) are configured to function as power supply terminals.

In the present invention, the engaging part and the attaching part are provided in the non-light emitting face of the light source unit, and the engaged part and the attached part are provided in the attachment face of the attachment unit, and accordingly they do not cover the side of the light-emitting face of the light source unit. A non-light emitting region in a side of the light emitting face can be reduced. In addition, the light source unit can be attached to and detached from the attachment unit while turning the light source unit with respect to the attachment unit, and therefore the light source unit including the light-emitting panel can be easily replaced.

BRIEF DESCRIPTION OF DRAWINGS

Preferred embodiments of the invention will now be described in further details. Other features and advantages of the present invention will become better understood with regard to the following detailed description and accompanying drawings where.

DESCRIPTION OF EMBODIMENTS

First Embodiment

Figure 1:
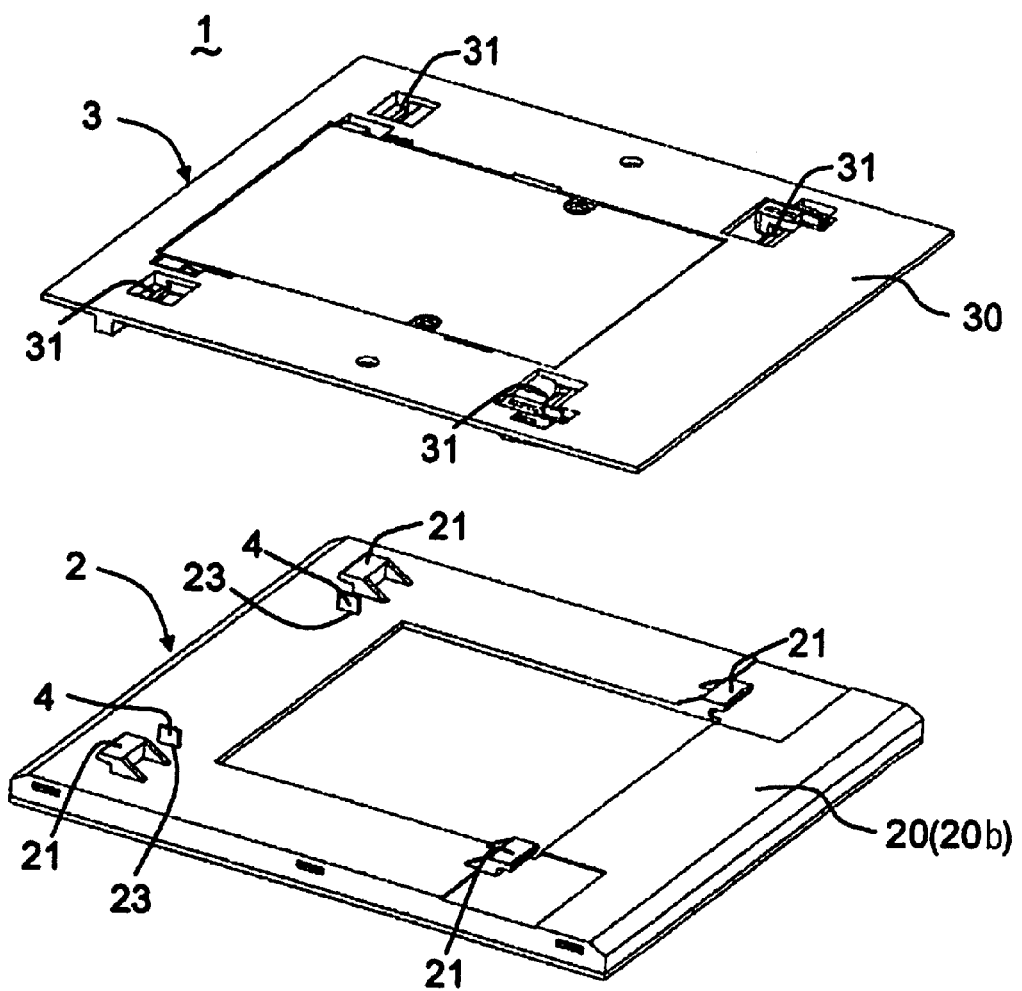
FIG. 1 is an exploded perspective view of a lighting apparatus in accordance with a first embodiment of the present invention.

A lighting apparatus in accordance with an embodiment of the present invention is explained with reference to FIGS. 1-6. As shown in FIGS. 1-6, the lighting apparatus 1 of the embodiment includes a light source unit 2 that has a case 20 storing therein a planar light-emitting panel 5 with an organic EL device, and an attachment unit 3 that has a housing 30 storing therein a (printed) circuit board 8 configured to control lighting of the light-emitting panel 5. In an example of FIG. 1, the housing 30 is a plate frame, and the circuit board 8 is held in the plate frame 30. A (printed-) wiring board 6 is stored in the case 20 of the light source unit 2 along with the light-emitting panel 5. The light source unit 2 is provided, on a surface (a back thereof) facing the attachment unit 3, with a plurality of (four) nails 21 adapted to engage with the attachment unit 3 and a plurality of (two) terminals 4 for electrically connecting the wiring board 6 and the circuit board 8 of the attachment unit 3. The terminals 4 protrude from the wiring board 6 of the light source unit 2, and are exposed at a side of the attachment unit 3 through a plurality of (two) slots 23 formed in the case 20. The attachment unit 3 includes a plurality of (four) holders 31 formed to be engaged with the nails 21 of the light source unit 2, and the light source unit 2 can be attached thereto and detached therefrom through the holders 31.

Figure 2:
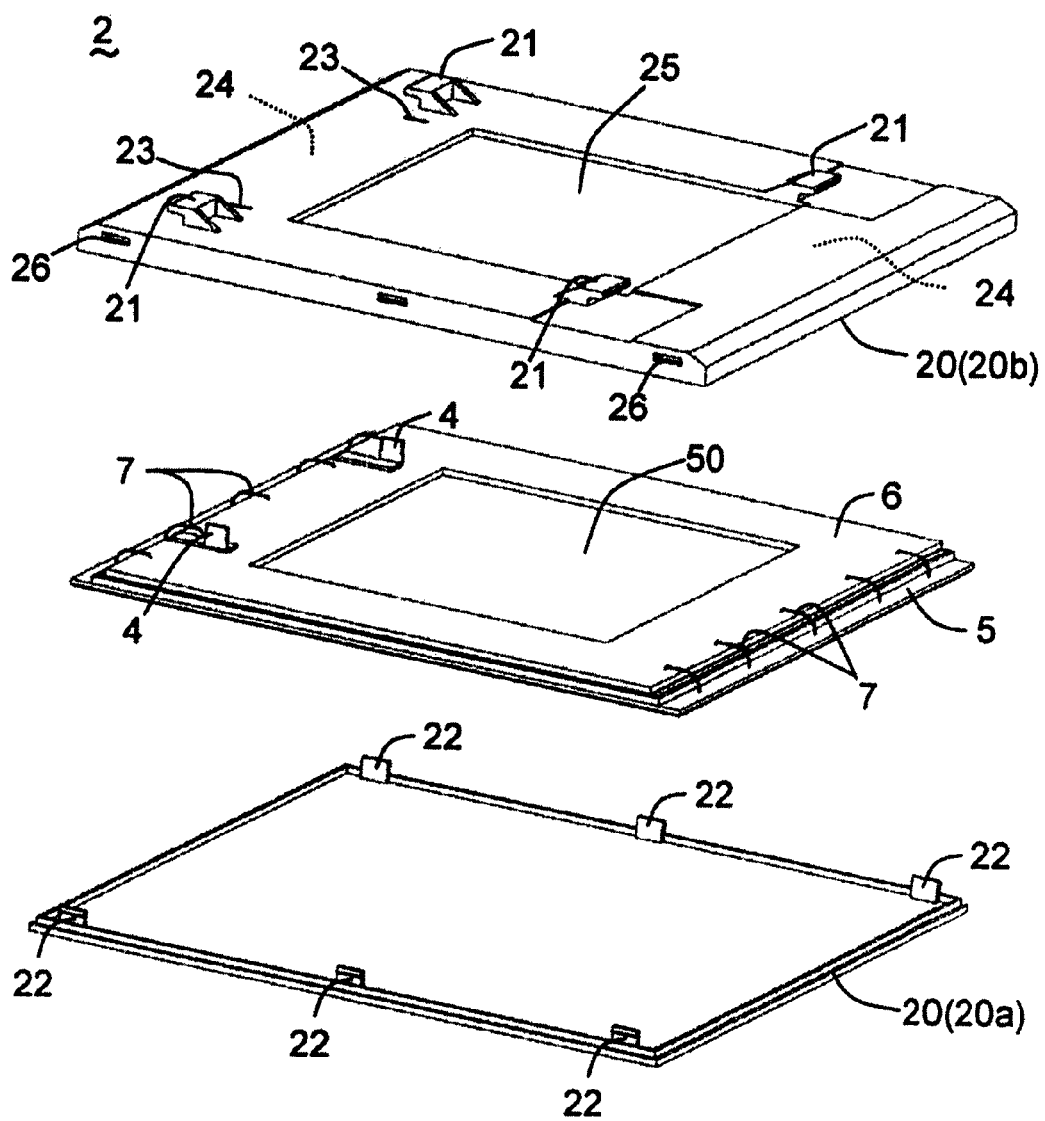
FIG. 2 is an exploded perspective view of a light source unit as seen from a side of an attachment unit in the lighting apparatus.

As shown in FIG. 2, in addition to the case 20, the light source unit 2 includes the light-emitting panel 5, and the wiring board 6 mounted on a side of a non-light emitting face (a back) of the light-emitting panel 5 (an upper side in the figure). The light-emitting panel 5 and the wiring board 6 are fixed by: a double-coated acrylic adhesive tape with core, having superior heat resistance, moisture resistance and stress-relaxation; or the like. The light-emitting panel and the wiring board are electrically connected with each other by ultrasonic welding of conductive wires 7 or the like.

The case 20 is formed of a front case 20a covering a side of a light-emitting face of the light-emitting panel 5 (a lower side in the figure), and a rear case 20b covering the side of the non-light emitting face. The front case 20a is formed of a transparent flat rectangular member. Besides, the front case 20a may be a rectangular frame member with an opening that faces the light-emitting panel 5, or a flat rectangular member of which surface that faces at least the light-emitting panel 5 is transparent. When the front case 20a is the former, it is preferable that a transparent protect cover or the like be placed at the opening. Engaging nails 22 for engaging with the rear case 20b protrude from a periphery of the front case 20a.

The rear case 20b is a member that is shaped like a flat case with a bottom and has an opening that faces the front case 20a of which front surface (in FIG. 2, upper surface) side's periphery is shaped like a convex toward the attachment unit 3, at a back (in FIG. 2, a lower surface) side of which a concave wiring board storage 24 storing therein the wiring board 6 is formed. The rear case 20b also includes a recess 25 formed of part thereof which is different from the wiring board storage 24. In other words, the wiring board storage 24 is shaped like a frame with the recess 25 placed at a center of the wiring board storage.

The rear case 20b integrally has the aforementioned nails 21 formed on a surface, facing the attachment unit 3, of the wiring board storage 24. In the example, the nails 21 are located at four positions, and a pair of nails 21 located in a longer direction of the rear case 20b is formed so that their tips mutually face outward. Engagement slots 26 adapted to engage with the engaging nails 22 of the front case 20a are provided in peripheral sides (two peripheral sides in the longer direction) of the rear case 20b. It is preferable that corners connecting the wiring board storage 24 and the peripheral sides with no engagement slot 26 (first and second ends of the light source unit 2 in the longer direction) should be chamfered as illustrated in the figure. As a result, the appearance of the light source unit 2 can be slimmed. The front case 20a and the rear case 20b constituting the case 20 have a voluntary form in response to the purposes of the lighting apparatus 1, and is made into a shape corresponding to the light-emitting panel 5. In the example, they are made into a long rectangular shape. For example, a constituent material used for the case 20 is plastic material such as ABS resin, acrylic resin, polystyrene resin or the like; or metallic material such as aluminum of which surface is insulated, or the like.

The light-emitting panel 5 is obtained by forming a light-emitting part on an optically-transparent rectangular substrate (not shown) to coat the outside of the light-emitting part with encapsulant. The light-emitting part is formed by stacking, in order, a positive electrode formed of a transparent conductive film, a luminous layer having a luminous function, and a negative electrode having light reflectivity. Materials commonly used for an organic EL device are used for the substrate, the positive electrode, the luminous layer, the negative electrode and the encapsulant. A soaking plate 50 formed of a copper sheet or the like is also provided on the encapsulant. Transparent electrode material such as ITO or the like commonly employed as a positive electrode has a comparatively low electrical conductivity with respect to electrically conducting material. Therefore, in the light-emitting panel 5 required to preferably enlarge a surface area of the light-emitting part in particular, increasing distance from a feeding point may cause voltage drop and dispersion in brightness in the light-emitting part. Therefore, metal patterns for preventing ITO's voltage drop, i.e., auxiliary electrodes are formed.

Figure 3:
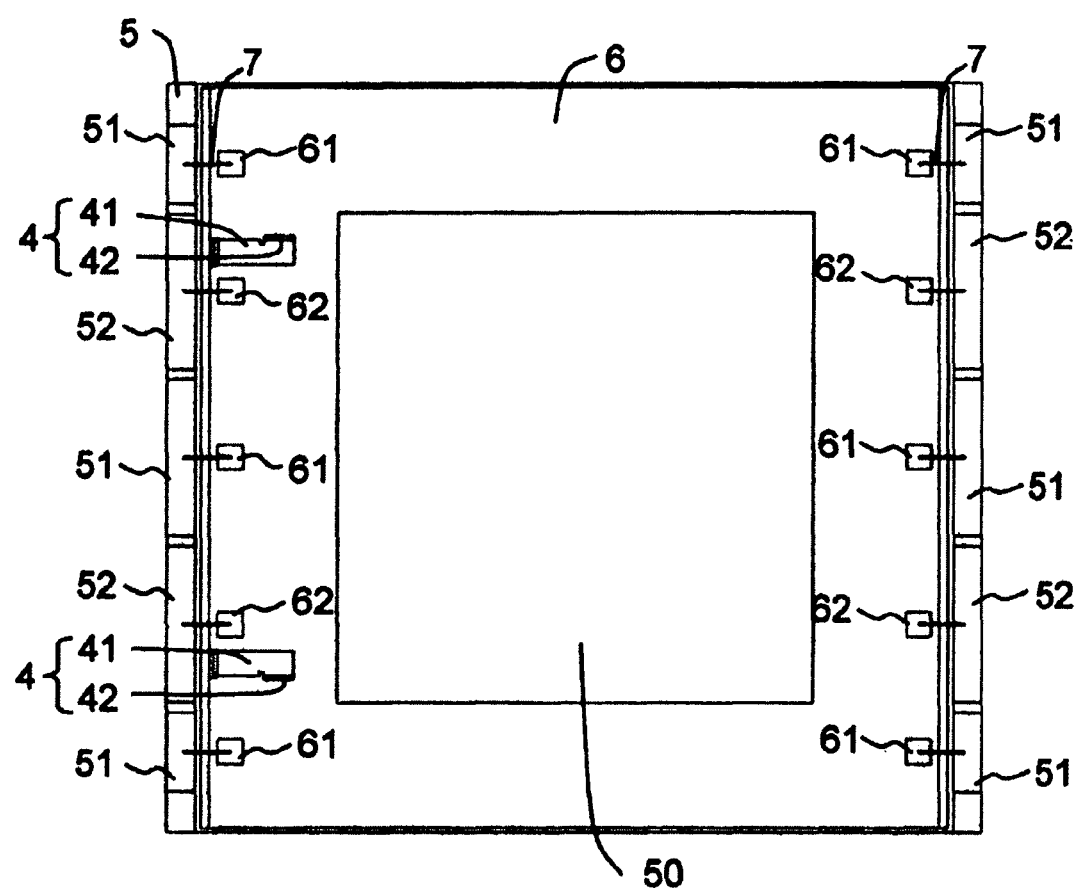
FIG. 3 is a front view of a light-emitting panel and a wiring board used for the light source unit of the lighting apparatus.

The auxiliary electrode is deposited by a method such as spattering or the like so that an opening is formed at part corresponding to a region where a luminous layer is formed in order not to prevent radiation of light toward the substrate. A periphery of an opening place of the auxiliary electrode is in contact with a positive electrode formed of ITO or the like, and part thereof is extended and power supply electrodes 51 for drawing a positive electrode are formed as shown in FIG. 3. In addition, by patterning so that part of a negative layer is extended, power supply electrodes 52 for drawing a negative electrode are formed. In the example of FIG. 3, the light-emitting panel 5 includes two ends corresponding to the first and second ends of the light source unit 2, each of which is provided with a plurality of (three) power supply electrodes 51 and a plurality of (two) power supply electrodes 52, which are alternately arranged. As shown in FIG. 3, it is preferable that the power supply electrodes 51, 52 be arranged so that electrodes of identical polarity are not adjoined to each other. That is, power supply electrodes of identical polarity, 51, 52 are arranged at a distance from each other, thereby dispersing feeding points to uniformize the voltage applied to the light-emitting part. As a result, dispersion in brightness can be hard to occur.

The wiring board 6 is shaped like a frame having an opening in a center thereof so as to be stored in the wiring board storage 24, by using base material having both incombustibility and low conductivity such as a glass fiberboard obtained by impregnating epoxy resin or the like into fiberglass cloth to harden the epoxy resin, for example, FR-4 or the like. Each terminal 4 is formed of a joined piece 41 joined to the wiring board 6, and a terminal piece 42 extending upright from the joined piece 41. In the example, a pair of terminals 4 is provided on one peripheral edge of the wiring board 6 (a side of the first end of the light source unit 2). The wiring board 6 is also provided with a positive electrode wire and a negative electrode wire (not shown), electrically connected with joined pieces 41 of the terminals 4. The electrode wires are coated with respective insulating materials, and respective parts thereof are exposed on an opposite surface of the wiring board from the light-emitting panel 5, thereby forming lands 61, 62. The lands 61, 62 are connected with the power supply electrodes 51, 52 electrically connected to the positive electrode and the negative electrode of the light-emitting panel 5 through conductive wires 7, respectively.

It is preferable that power supply electrodes of identical polarity, 51 or 52 in the light-emitting panel 5 should be not connected with each other through conductive wires 7 but electrically connected with each other through conductive wires 7 and the wiring board 6. If the power supply electrodes 51 arranged at peripheral edges of the light-emitting panel 5 are connected with each other, each of the connecting conductive wires 7 takes an arch shape. In this case, the rear case 20b requires a prescribed space for preventing the tops of the conductive wires 7 from touching the rear case 20b. In the present example, power supply electrodes of identical polarity, 51 or 52 are connected through conductive wires 7 and the wiring board 6, and it is therefore unnecessary to dispose conductive wires 7 at the peripheral edges of the light-emitting panel 5. In this structure, as described above, the corners of the rear case 20b can be chamfered and the light source unit 2 can be slimmed.

Figure 4:
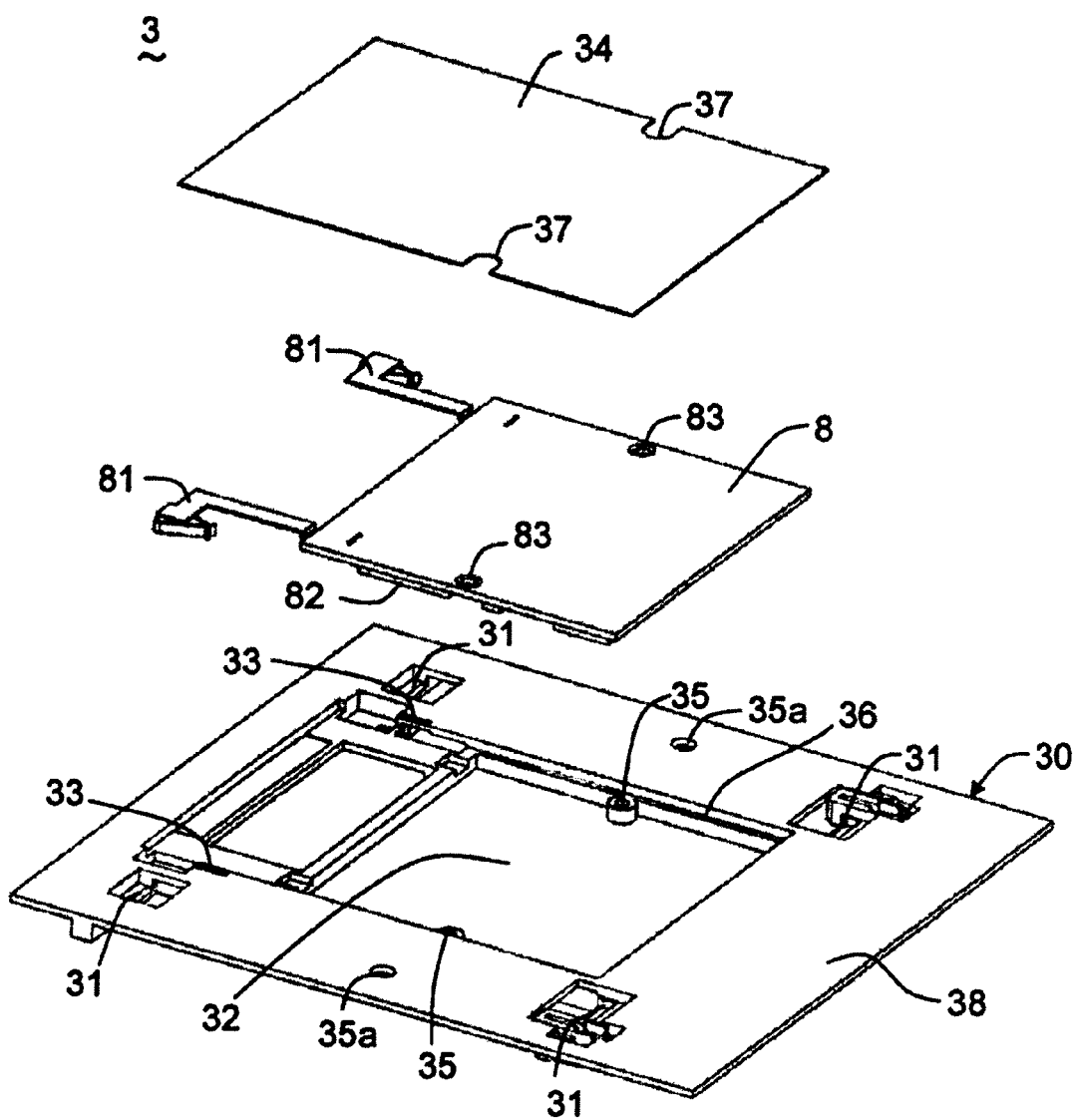
FIG. 4 is an exploded perspective view of the attachment unit as seen from an opposite side to the light source unit in the lighting apparatus.
Figure 5:
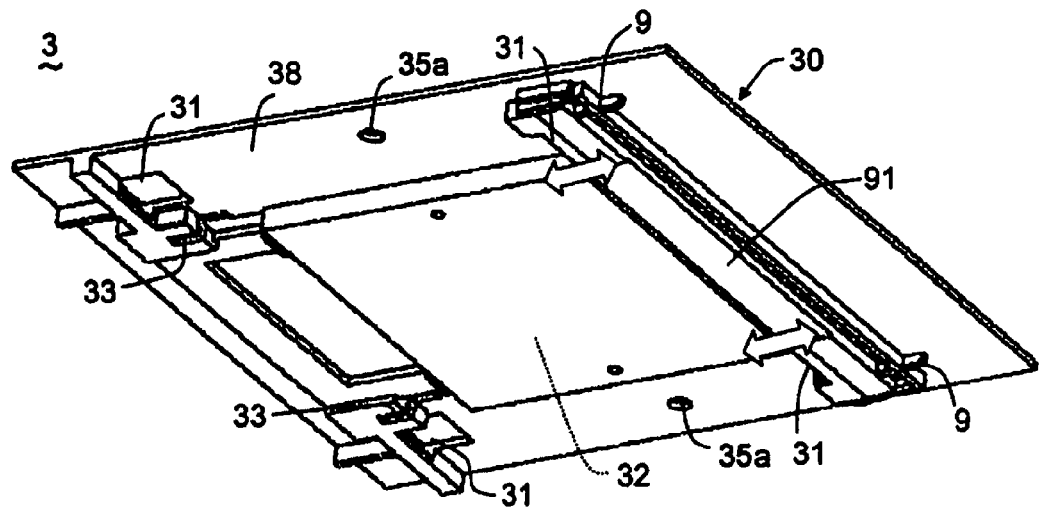
FIG. 5 is a perspective view of the attachment unit as seen from a side of the light source unit in the lighting apparatus.

As shown in FIGS. 4 and 5, in addition to the housing 30, the attachment unit 3 includes the circuit board 8 for controlling lighting of the light-emitting panel 5, and a pair of terminal supports 81 for electrically connecting the terminals 4 and the circuit board 8. A side of the housing 30, facing the light source unit 2 is shaped like a convex, and a concave circuit board storage 32 storing therein the circuit board 8 is formed at a back side of the housing. The housing 30 is also provided with penetrated slits 33 through which the terminals 4 are inserted.

A base material similar to the wiring board 6 is used for the circuit board 8. Various devices 82 such as a driver for performing lighting drive of the light-emitting panel 5, or the like are mounted on a surface, facing the light source unit 2, of the base material that is shaped like a rectangle. The circuit board 8 is also provided with joined parts to the terminal supports 81, and terminals for external power supply (not shown). The joined parts, the terminals for external power supply, the driver and the like are electrically connected through wiring patterns formed on the circuit board 8. The terminal supports 81 are two metal pieces each of which is bent like an "L", and one ends thereof are connected with the circuit board 8, while the other ends are extended upright toward the light source unit 2. The pieces extended upright, each of which is in the shape of a leaf spring, press the terminals 4 inserted into the penetrated slits 33 (see FIG. 1). It is accordingly possible to secure the electrical connection between the terminal supports 81 and the terminals 4. The terminal supports 81 may be configured to create click feeling when being connected with the terminals 4. The circuit board 8 and the terminal supports 81 are covered with an electric insulating plate 34 from an opposite side to their surface facing the light source unit 2, and protected from the physical and electrical influence from the outside.

The circuit board storage 32 is configured to be placed at a center of the attachment unit 3 and fitted to the recess 25 of the rear case 20b. A plurality of (two) screw receiving parts 35 is disposed in the circuit board storage 32. A holder frame 36 is formed at peripheral edges of the circuit board storage 32. The holder frame 36 holds the circuit board 8 along with the screw receiving parts 35 with the circuit board floated so as to prevent various devices 82 such as driver and the like mounted on the circuit board 8 from touching a bottom of the circuit board storage 32. A plurality of (two) screw holes 83 is formed at the positions of the circuit board 8 which correspond to the screw receiving parts 35 of the circuit board storage 32, while the electric insulating plate 34 is provided with notches 37. Screws (not shown) are inserted into the notches 37, the screw holes 83 and the screw receiving parts 35, and thereby fixing the circuit board 8 and the electric insulating plate 34 to the housing 30. The screw receiving parts 35 and the holder frame 36 hold the circuit board 8 so that a surface (a back surface) of the circuit board 8, on which the various devices 82 are not mounted, is placed at a position lower by a thickness of the electric insulating plate 34 than a surrounding part 38 of the circuit board storage 32. As a result, the electric insulating plate 34 and the surrounding part 38 form a smooth surface without difference in level when the electric insulating plate 34 is fixed to the housing 30 (see FIG. 1). It is therefore possible to stably carry out installing of the attachment unit 3 on a mounting face such as a wall or the like without backlash. The surrounding part 38 is provided with fixing holes 35a through which fixing members (not shown) for fixing the attachment unit 3 to a wall or the like are inserted.

As shown in FIG. 5, the holders 31 is formed in a surface of the housing 30, facing the light source unit 2. The holders 31 are placed at positions corresponding to the nails 21 of the light source unit 2 (see FIG. 1). Holders 31 corresponding to at least two nails 21 are configured to be free to slide and are biased inward with bias mechanisms 9 such as springs or the like. It is preferable that holders 31 that are free to slide should be combined through a slide piece 91 as illustrated in the figure. In this configuration, if one holder 31 is slid, another holder 31 combined through the slide piece 91 is also slid. It is therefore possible to easily detach the light source unit 2 from the attachment unit 3.

Figure 6A:
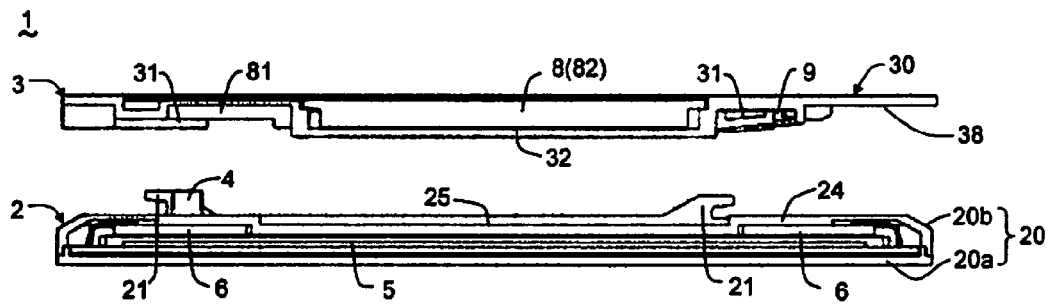
FIG. 6A is a lateral view of the light source unit and the attachment unit with the light source unit detached from the attachment unit in the lighting apparatus.
Figure 6B:
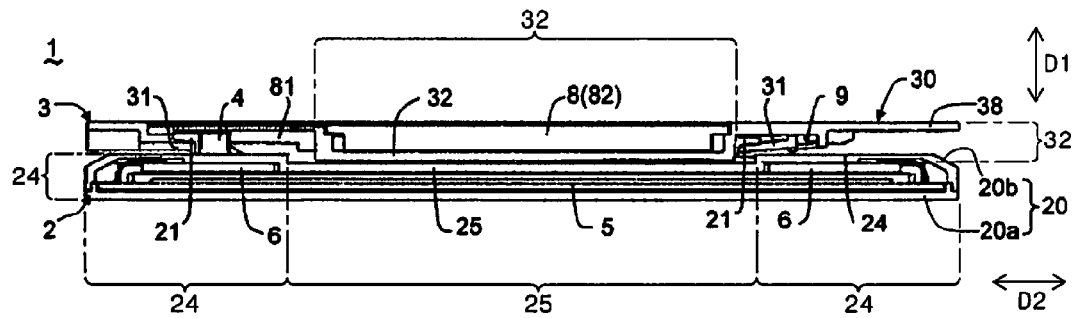
FIG. 6B is a lateral view of the light source unit and the attachment unit with the light source unit attached to the attachment unit.

An operational procedure for replacing the light source unit 2 of the lighting apparatus 1 is explained with reference to FIGS. 6A and 6B. When installing the lighting apparatus 1, the attachment unit 3 is fixed on a mounting face (not shown) such as a wall, a ceiling, or a housing forming a lighting fixture body in advance. As shown in FIG. 6A, the light source unit 2 is located in front of the attachment unit 3 so that the terminals 4 and the terminal supports 81 are placed in an identical side. As shown in FIG. 6B, the light source unit 2 is then attached to the attachment unit 3. At this time, the nails 21 corresponding to the holders 31 provided with the bias mechanisms 9 are first engaged with the holders 31, and the holders 31 are slid outward. The other nails 21 are then engaged with the holders 31 having no bias mechanism 9. In this configuration, the holders 31 engaged ahead returns inward by the bias mechanisms 9, and all the nails 21 are engaged with the holders 31, and it is accordingly possible to easily attach the light source unit 2 to the attachment unit 3. In addition, at this time, since the terminals 4 are connected to the terminal supports 81, the physical attachment and electrical connection between the light source unit 2 and the attachment unit 3 can be performed at the same time.

When the light source unit 2 is detached from the attachment unit 3, the holders 31 provided with the bias mechanisms 9 (springs or the like) are pressed with the light source unit 2 held by hand, and thereby the light source unit is slid. As a result, the nails 21 having no bias mechanism 9 are released from the holders 31. Therefore, the light source unit 2 can be easily detached from the attachment unit 3 by moving the released end of the light source unit 2. The holders 31 provided with the bias mechanisms 9 can be slid: by a finger in case lighting apparatuses 1 are arranged in line; or in case lighting apparatuses 1 are arranged in a lattice pattern, by a rod member to be inserted into each gap. In these cases, the light source unit 2 can be detached from the attachment unit 3 like stated above.

In the lighting apparatus 1 of the present embodiment, the wiring board storage 24 and the circuit board storage 32 are configured so that the case 20 of the light source unit 2 and the housing 30 of the attachment unit 3 are fitted into each other and the wiring board 6 and the circuit board 8 are arranged so as not to overlap with each other. In other words, the case 20 of the light source unit 2 and the housing 30 of the attachment unit 3 are configured so that, in an attachment state of the back of the light source unit 2 to the attachment unit 3 (FIG. 6B), a whole of the wiring board storage 24 and a whole of the circuit board storage 32 are arranged at different positions in a direction D2 (a horizontal direction) perpendicular to an attachment direction D1 (a vertical direction) of the back of the light source unit 2 to the attachment unit 3 and the case 20 and the housing 30 are fitted into each other. In this configuration, both the wiring board 6 and the circuit board 8 are disposed in the side of the non-light emitting face of the light-emitting panel 5 in the attachment state of the light source unit 2 to the attachment unit 3, and accordingly a light-emitting region in the side of the light emitting face thereof can be enlarged. Therefore, even when lighting apparatuses 1 are arranged side by side, their light-emitting panels 5 can be arranged to be adjacent to each other, thereby assembling a lighting system having a large light-emitting surface area. In addition, since the wiring board 6 and the circuit board 8 are stored in a non-overlapping state, it is possible to thin a thickness of the lighting apparatus 1 as compared with the case where they are stored in an overlapping state.

The recess 25 of the case 20, and the circuit board storage 32 of the housing 30 shaped like a convex toward the light source unit 2 are formed at positions corresponding to each other, and configured to be fitted into each other by a tongue-and-groove joint. That is, the case 20 of the light source unit 2 has a concave shape, and the housing 30 of the attachment unit 3 has a convex shape. The circuit board storage 32 of the attachment unit 3 requires a space for storing therein the various devices 82 and the like mounted on the circuit board 8, and accordingly a protruding space thereof is larger than a protruding space of the wiring board storage 24 of the light source unit 2 (a depth of the recess 25). Therefore, as shown in FIG. 6B, a few gap is formed between the surrounding part 38 of the circuit board storage 32 and the wiring board storage 24. It is possible to store, in the gap, the heads of the screws for fixing the attachment unit 3 to a mounting face or the like, external electric supply lines for supplying electric power to the circuit board 8, and the like.

The wiring board 6 is shaped like a frame, and the circuit board 8 is disposed at the center of the attachment unit 3 so as to be aligned to the central opening of the frame-shaped wiring board 6. In this configuration, the lands 61, 62 in the frame-shaped wiring board 6 can be placed at positions adjacent to the power supply electrodes 51, 52 of the light-emitting panel 5. As a result, each conductive wire 7 can have a short connecting distance, thereby lowering the height of its own top, and the case 20 can be thinned. In addition, the amount of the conductive wires 7 can be reduced. A rectangular substrate can be used for the circuit board 8, and accordingly the various devices 82 such as driver and the like mounted on the circuit board 8 can be arranged concentratively without dispersion.

In the lighting apparatus 1, the light source unit 2 having the light-emitting panel 5 and the attachment unit 3 having the circuit board 8 have different bodies from each other. Accordingly, a user can replace the only light source unit 2 when a lighting failure occurs, such as a malfunction of the light-emitting panel 5, the end of a device's life or the like. In addition, the light source unit 2 does not have the circuit board 8 and the like, and accordingly can be produced at a low cost as compared with a module storing therein the light source unit and the like.

In the present invention, numerous modifications can be made as long as the wiring board storage 24 and the circuit board storage 32 are configured so that the case 20 and the housing 30 are fitted into each other and the wiring board 6 and the circuit board 8 are arranged so as not to overlap with each other. For example, the aforementioned embodiment illustrates the configuration that the circuit board storage 32 is fit into the recess 25 of the case 20, but the wiring board storage 24 and circuit board storage 32 may be each shaped like rectangles, and arranged alternately so as to share prescribed space. The circuit board storage 32 may be also shaped like a frame so that the wiring board storage 24 is fitted into the circuit board storage 32.

Second Embodiment

In the lighting apparatus described in Document 2, the concavity overlaps with part of a light-emitting face of the light-emitting panel, which causes a non-light emitting region (a region where no light is emitted) on the light-emitting face. As a result, in case light-emitting panels are arranged side by side for example, it is impossible to assemble a lighting system having a large light-emitting face due to non-light emitting in the concavity. Also, in the lighting apparatus described in Document 3, part of the enclosure overlaps with part of a light-emitting face of the light-emitting panel, which causes a non-light emitting region as well. In this sort of lighting apparatus, facilitating the attachment of a light-emitting panel causes unsteady holding of the light-emitting panel, and securely holding the light-emitting panel may make attachment and detachment difficult.

The second embodiment is a lighting apparatus configured to be capable of enlarging a light-emitting region in a side of a light-emitting face, and easily replacing a light source unit including a light-emitting panel.

Figure 7:
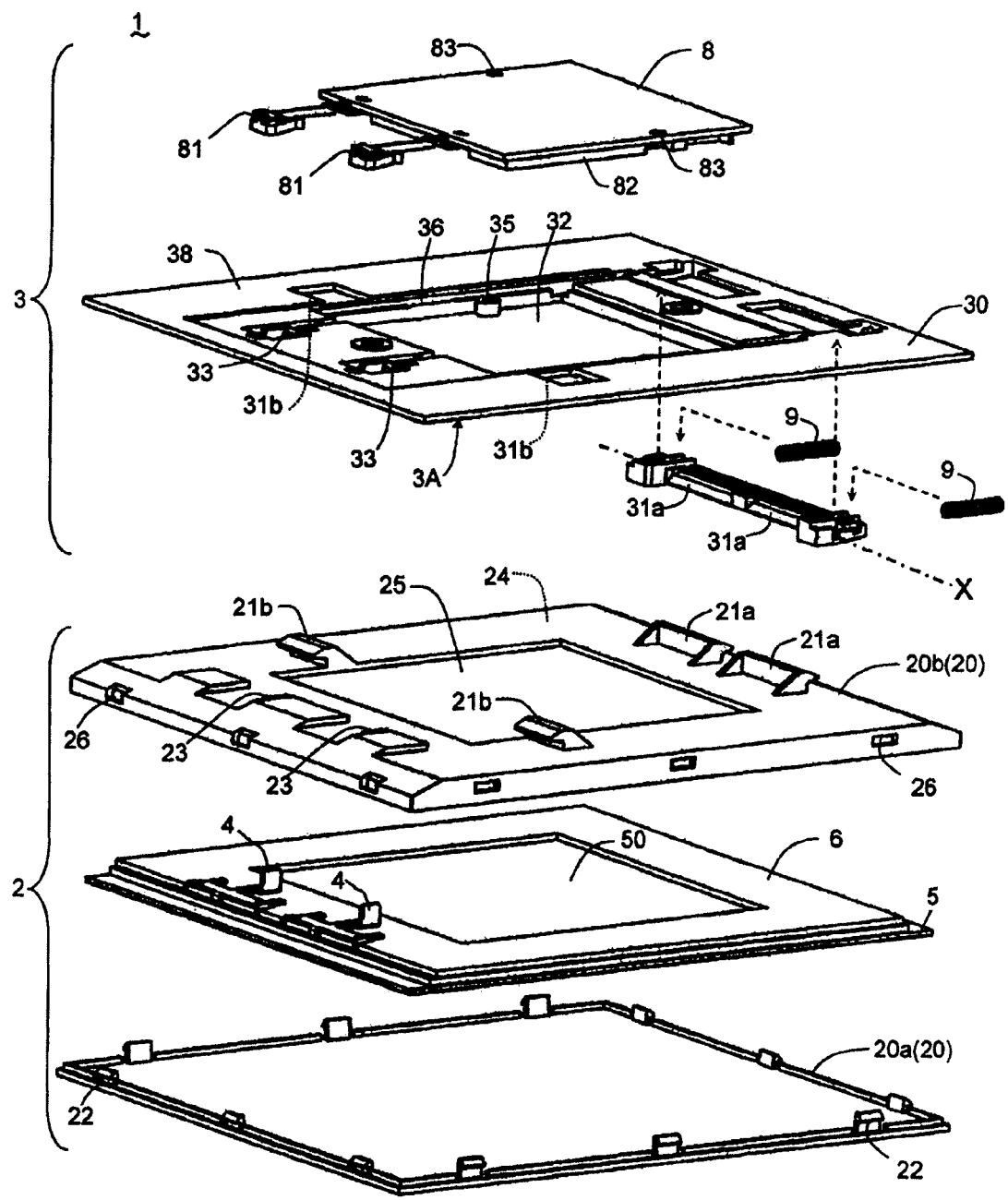
FIG. 7 is an exploded perspective view of a lighting apparatus in accordance with a second embodiment of the present invention.

The lighting apparatus in accordance with the second embodiment of the present invention is explained with reference to FIGS. 7-12. As shown in FIG. 7, the lighting apparatus 1 in the embodiment is configured like the first embodiment, and includes: a light source unit 2 having a planar light-emitting panel 5 with an organic EL device; and an attachment unit 3 configured to be detachably attached to the light source unit 2. The attachment unit 3 has a housing 30 storing therein a circuit board 8 for controlling lighting of the light-emitting panel 5. A wiring board 6 is stored in a case 20 of the light source unit 2 along with the light-emitting panel 5. The light source unit 2 includes, in a surface thereof facing the attachment unit 3, a plurality of (two) terminals 4 adapted to electrically connect the wiring board 6 of the light source unit 2 and the circuit board 8 of the attachment unit 3. The terminals 4 are protruded from the wiring board 6 of the light source unit 2 and exposed at a side of the attachment unit 3 through slots 23 formed in the case 20. In an example of FIG. 7, the terminals 4 and the slots 23 are disposed at one end side (a first side) in a longer direction of the light source unit 2 shaped like a rectangle.

A pair of engaging parts 21a is disposed on one end of a non-light emitting face (a back) of the light source unit 2. A pair of engaged parts 31a configured to be engaged with the engaging parts 21a is disposed on an attachment face 3A of the attachment unit 3 to which the light source unit 2 is attached. In an example of FIG. 7, the pair of engaging parts 21a is disposed on another end side (a second side) of the light source unit 2 in a longer direction thereof, while the pair of engaged parts 31a is disposed on one end side (a second side) of the attachment unit 3, which is shaped like a rectangle, in a longer direction thereof. In a state that the engaging parts 21a engage with the engaged parts 31a, the light source unit 2 is free to turn with respect to the attachment unit 3. That is, a side of an end (a first end) of the light source unit 2 is free to turn around a side of another end (a second end) thereof with respect to the attachment unit 3. Each engaging part 21a is shaped like a hook of which tip is directed outward. Each engaged part 31a has a shape corresponding to an engaging part 21a (in the example of FIG. 7, a shape with a cross section of a half-trapezoid (a pillar shape)). Each of the engaging parts 21a and the engaged parts 31a has a predetermined width, and engagement positions thereof in a width direction correspond to a pivot axis X. In the example, each engaged part 31a is attached to the housing 30 so as to be free to slide, and is biased toward a center of the attachment unit 3 in a longer direction thereof through a bias mechanism 9 such as a spring or the like. It is preferable that the pair of engaged parts 31a should be combined as illustrated in the figure. As a result, a worker can easily slide the pair of engaged parts 31a.

A plurality of (two) attaching parts 21b is disposed on part of the non-light emitting face of the light source unit 2, which is different from one end (a second end) where the engaging parts 21a are disposed, specifically on an opposite side to the one end (on a first end side). The attachment unit 3 is provided with a plurality of (two) attached parts 31b for retaining the plurality of attaching parts 21b which is disposed in the attachment face 3A. Each attaching part 21b is shaped like a hook of which tip is directed outward like the engaging parts 21a. Each attached part 31b has a shape corresponding to an attaching part 21b (in the example of FIG. 7, a rectangular hole). The attaching parts 21b and the attached parts 31b retain the light source unit 2 when being attached to the attachment unit 3.

In the light source unit 2, a wiring board 6 is mounted on the non-light emitting face of the light-emitting panel 5. The light-emitting panel 5 and the wiring board 6 are fixed by: a double-coated acrylic adhesive tape with core, having superior heat resistance, moisture resistance and stress-relaxation; or the like. Power supply electrodes of the light-emitting panel 5 and the wiring board 6 are electrically connected with each other by ultrasonic welding of conductive wires (not shown) or the like.

The case 20 is formed of a front case 20a covering a side of a light-emitting face of the light-emitting panel 5 (a lower side in the figure), and a rear case 20b covering the side of the non-light emitting face. The front case 20a is formed of a transparent flat rectangular member. Besides, the front case 20a may be a rectangular frame member with an opening that faces the light-emitting panel 5, or a flat rectangular member of which surface that faces at least the light-emitting panel 5 is transparent. When the front case 20a is the former, it is preferable that a transparent protect cover or the like should be placed at the opening. Engaging nails 22 adapted to engage with the rear case 20b protrude from a periphery of the front case 20a.

The rear case 20b is a member that is shaped like a flat case with a bottom and has an opening that faces the front case 20a of which front surface side's (a side facing the attachment unit 3) periphery is shaped like a convex toward the attachment unit 3. A concave wiring board storage 24 storing therein the wiring board 6 is formed at a back side of the rear case. The rear case 20b also includes a recess 25 formed of a bottom thereof which is different from the wiring board storage 24. In other words, the wiring board storage 24 is shaped like a frame with the recess 25 placed at a center of the wiring board storage.

The aforementioned engaging parts 21a and attaching parts 21b are formed integrally with the rear case 20b on a surface of the wiring board storage 24, facing the attachment unit 3. Engagement slots 26 adapted to engage with the engaging nails 22 of the front case 20a are provided in peripheral sides of the rear case 20b. It is preferable that corners connecting peripheral sides of the rear case 20b and the wiring board storage 24 should be partially chamfered as illustrated in the figure. In the example of FIG. 7, the first and second ends of the light source unit 2 are chamfered. As a result, the appearance of the light source unit 2 can be slimmed. The front case 20a and the rear case 20b constituting the case 20 have a voluntary form in response to the purposes of the lighting apparatus 1, and is made into a shape corresponding to the light-emitting panel 5. In the example, they are made into a long rectangular shape. For example, a constituent material used for the case 20 is plastic material such as ABS resin, acrylic resin, polystyrene resin or the like; or metallic material such as aluminum of which surface is insulated, or the like.

The light-emitting panel 5 is obtained by forming a light-emitting part on an optically-transparent rectangular substrate (not shown) to coat the outside of the light-emitting part with encapsulant. The light-emitting part is formed by stacking, in order, a positive electrode formed of a transparent conductive film, a luminous layer having a luminous function, and a negative electrode having light reflectivity. Materials commonly used for an organic EL device are used for the substrate, the positive electrode, the luminous layer, the negative electrode and the encapsulant. A soaking plate 50 formed of a copper sheet or the like is also provided on the encapsulant.

The wiring board 6 is shaped like a frame having an opening in a center thereof so as to be stored in the wiring board storage 24, by using base material having both incombustibility and low conductivity such as a glass fiberboard obtained by impregnating epoxy resin or the like into fiberglass cloth to harden the epoxy resin, for example, FR-4 or the like. Each terminal 4 is formed of a joined piece joined to the wiring board 6, and a terminal piece extending upright from the joined piece. In the example, a pair of terminals 4 is provided on one peripheral edge of the wiring board 6. The wiring board 6 is also provided with a positive electrode wire and a negative electrode wire (not shown), electrically connected with the terminals 4. The electrode wires are coated with respective insulating materials, and respective parts thereof are exposed on an opposite surface of the wiring board from the light-emitting panel 5, thereby forming lands (not shown). The lands are connected with the power supply electrodes (not shown) electrically connected to the positive electrode and the negative electrode of the light-emitting panel 5 through conductive wires, respectively.

In addition to the housing 30 and the circuit board 8, the attachment unit 3 includes a pair of terminal supports 81 for electrically connecting the terminals 4 and the circuit board 8. A side of the housing 30, facing the light source unit 2 is shaped like a convex, and a concave circuit board storage 32 storing therein the circuit board 8 is formed. The housing 30 is also provided with a plurality of (two) penetrated slits 33 through which the terminals 4 are inserted.

A base material similar to the wiring board 6 is used for the circuit board 8. Various devices 82 such as a driver for performing lighting drive of the light-emitting panel 5, or the like are mounted on a surface, facing the light source unit 2, of the base material that is shaped like a rectangle. The circuit board 8 is also provided with joined parts to the terminal supports 81, and terminals for external power supply (not shown). The joined parts, the terminals for external power supply, the driver and the like are electrically connected through wiring patterns formed on the circuit board 8. The terminal supports 81 are two metal pieces each of which is bent like an "L", and one ends thereof are connected with the circuit board 8, while the other ends are extended upright toward the light source unit 2. The pieces extended upright, each of which is in the shape of a leaf spring, clamp the terminals 4 inserted into the penetrated slits 33 (see FIG. 7). It is accordingly possible to secure the electrical connection between the terminal supports 81 and the terminals 4. The terminal supports 81 may be configured to create click feeling when being connected with the terminals 4. The circuit board 8 and the terminal supports 81 are covered with an electric insulating plate (not shown) from an opposite side to their surface facing the light source unit 2, and protected from the physical and electrical influence from the outside.

The circuit board storage 32 is configured to be placed at a center of the attachment unit 3 and fitted to the recess 25 of the light source unit 2. A plurality of (two) screw receiving parts 35 are disposed in the circuit board storage 32. A holder frame 36 is formed at peripheral edges of the circuit board storage 32. The holder frame 36 holds the circuit board 8 along with the screw receiving parts 35 with the circuit board 8 floated so as to prevent various devices 82 mounted on the circuit board 8 from touching a bottom of the circuit board storage 32. A plurality of (two) screw holes 83 is formed at the positions of the circuit board 8 which correspond to the screw receiving parts 35 of the circuit board storage 32. Screws (not shown) are inserted into the screw holes 83 and the screw receiving parts 35, and thereby fixing the circuit board 8 to the housing 30. The screw receiving parts 35 and the holder frame 36 hold the circuit board 8 so that a surface (a back surface) of the circuit board 8, on which the driver and the like of the circuit board 8 are not mounted, substantially forms a smooth surface along with a surrounding part 38. It is therefore possible to perform a stable installation without backlash when the attachment unit 3 is installed on a mounting face such as a wall or the like.

Figure 8:
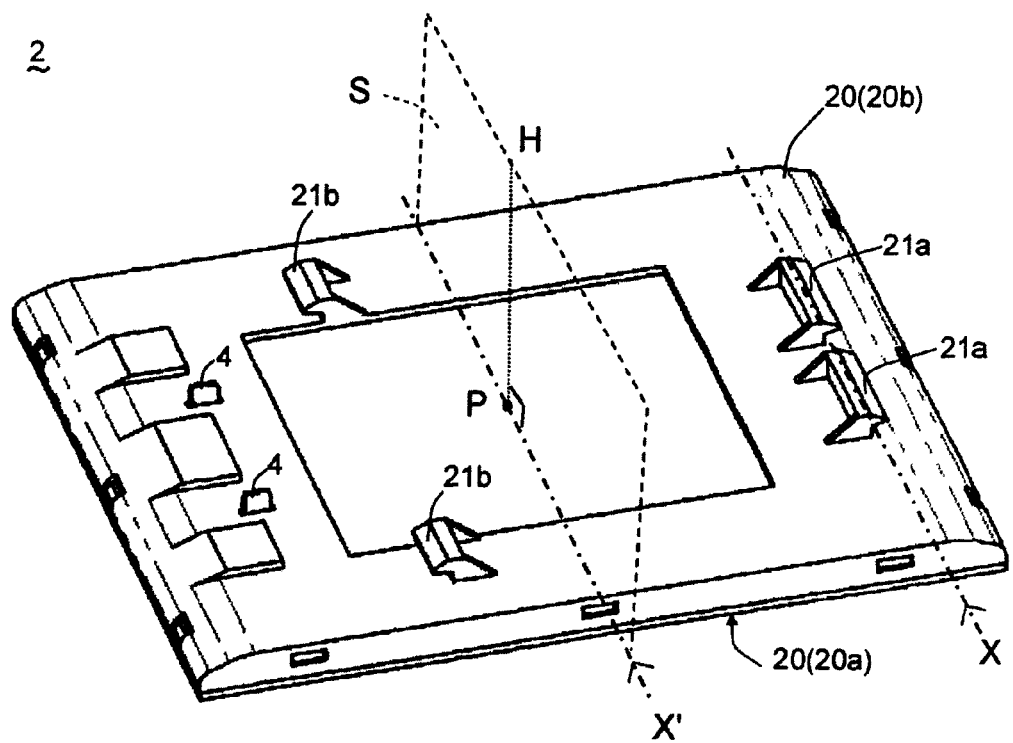
FIG. 8 is a perspective view of a light source unit as seen from a side of an attachment unit in the lighting apparatus.

As shown in FIG. 8, the attaching parts 21b are disposed on other side (the first end side of the light source unit 2) different from the engaging parts 21a with respect to the center plane S of the light source unit 2. The center plane S includes a normal line H to a surface facing the attachment unit 3 (or the attachment face 3A (see FIG. 7)) and a line X' parallel to a pivot axis X around which the light source unit 2 is free to turn with respect to the attachment unit 3, and is a plane passing through a center part P of the light source unit 2. That is, as illustrated in the figure, when the engaging parts 21a are disposed on one end (the second end) of the light source unit 2, the attaching parts 21b are disposed on a position further than at least the center plane S from the engaging parts 21a (the first end side of the light source unit 2). Thus, the engaging parts 21a and the attaching parts 21b are disposed apart from each other, and it is accordingly possible to disperse a force added to the engaging parts 21a and the attaching parts 21b to reduce local stresses even when a load is placed on the light source unit 2 with the light source unit 2 attached to the attachment unit 3. In addition, the light source unit 2 can be easily maintained horizontally with respect to the attachment unit 3.

Figure 9:
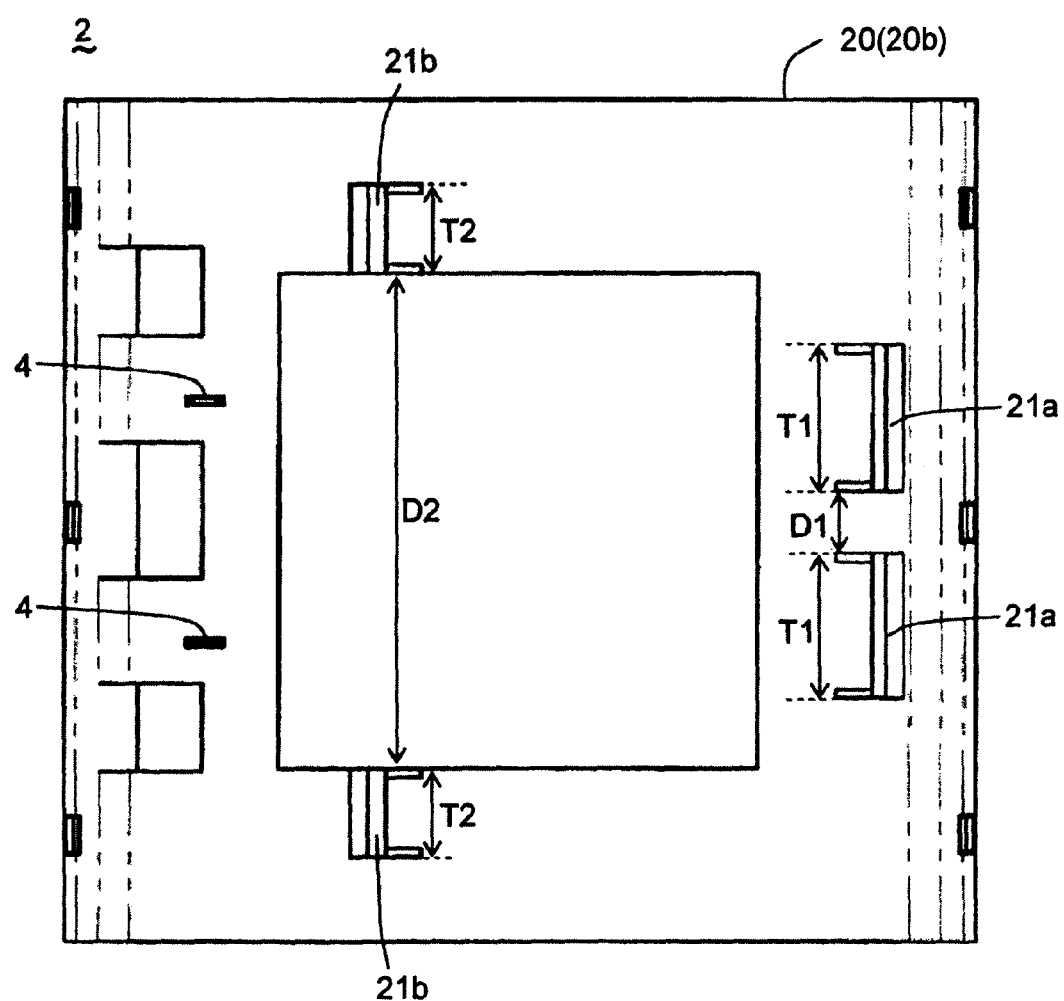
FIG. 9 is a front view of the light source unit as seen from the side of the attachment unit in the lighting apparatus.

As shown in FIG. 9, the engaging parts 21a and the attaching parts 21b are formed so that the engaging parts differ in width along a direction of the pivot axis X from the attaching parts. In the example, each width T1 of the engaging parts 21a is wider than each width T2 of the attaching parts 21b. In addition, the engaged parts 31a and the attached parts 31b have corresponding shapes to the engaging parts 21a and the attaching parts 21b, respectively (see FIG. 10 as stated below). In this structure, it is possible to prevent the light source unit 2 from being attached in a wrong orientation when the light source unit 2 is attached to the attachment unit 3, because the engaging parts 21a having wider widths cannot engage with the attached parts 31b having narrower widths.

Moreover, the engaging parts 21a and the attaching parts 21b are provided one pair each, and configured so that an interval D1 of the pair of the engaging parts 21a differs from an interval D2 of the pair of the attaching parts 21b. In the example, the interval D1 of the pair of the engaging parts 21a is narrower than the interval D2 of the pair of the attaching parts 21b. The engaged parts 31a and the attached parts 31b are disposed at positions corresponding to the engaging parts 21a and the attaching parts 21b, respectively. In this structure, it is possible to prevent the light source unit 2 from being attached in a wrong orientation as above, because the pair of attaching parts 21b having the wider interval cannot be attached to the pair of engaged parts 31a having the narrower with.

Figure 10:
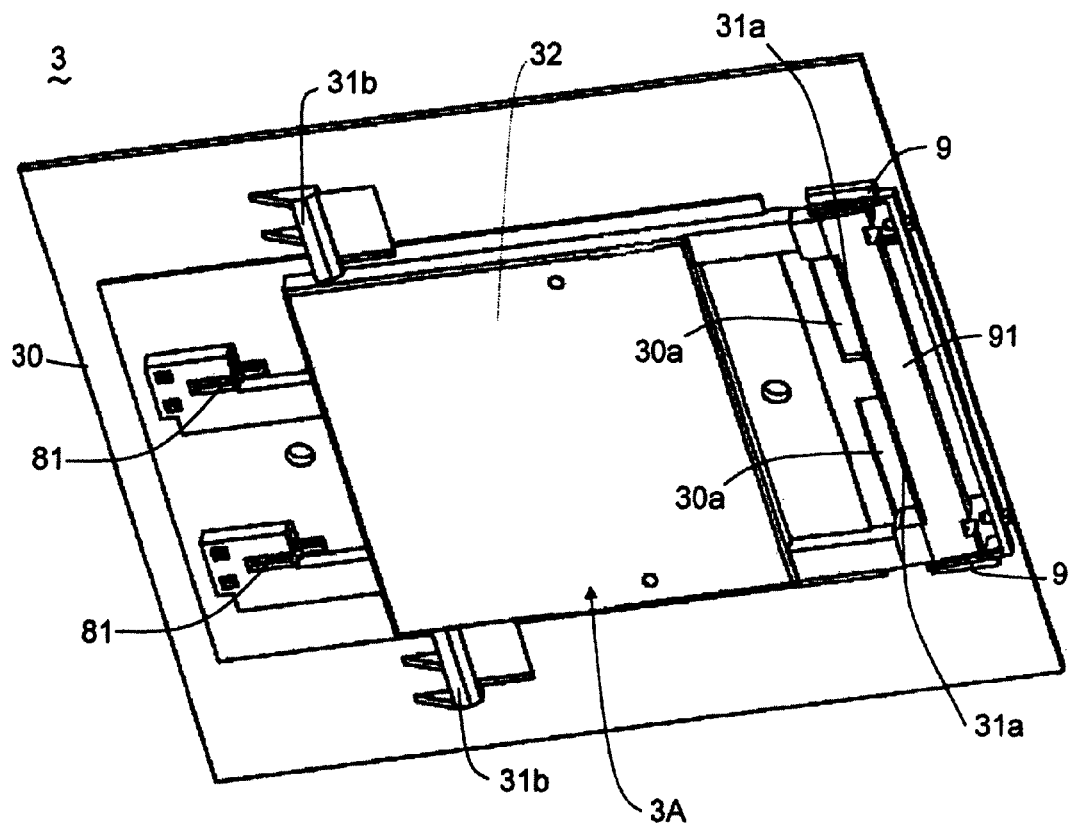
FIG. 10 is a perspective view of the attachment unit as seen from the side of the light source unit in the lighting apparatus.

As shown in FIG. 10, the attachment unit 3 is provided, on a surface of the housing 30 facing the light source unit 2, with the aforementioned engaged parts 31a and the attached parts 31b. The engaged parts 31a and the attached parts 31b are disposed at positions corresponding to the engaging parts 21a and the attaching parts 21b (see FIG. 7). Depressions 30a are formed at positions of the housing 30 facing the engaged parts 31a. The depressions 30a may be thinner in thickness than other part of the housing 30, or penetrate through to the back side of the attachment unit 3.

Figure 11:
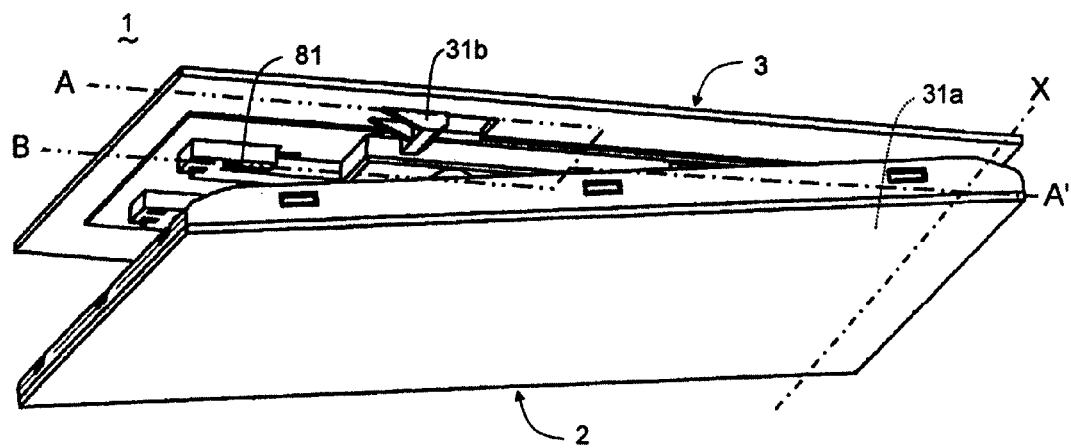
FIG. 11 is a perspective view showing that the light source unit is free to turn with respect to the attachment unit in the lighting apparatus.
Figure 12A:
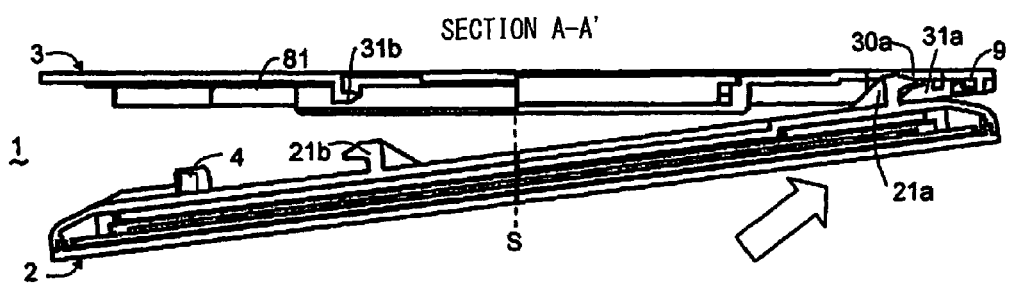
FIGS. 12A-12C are longitudinal sectional views showing procedures for attaching the light source unit to the attachment unit in the lighting apparatus.
Figure 12B:
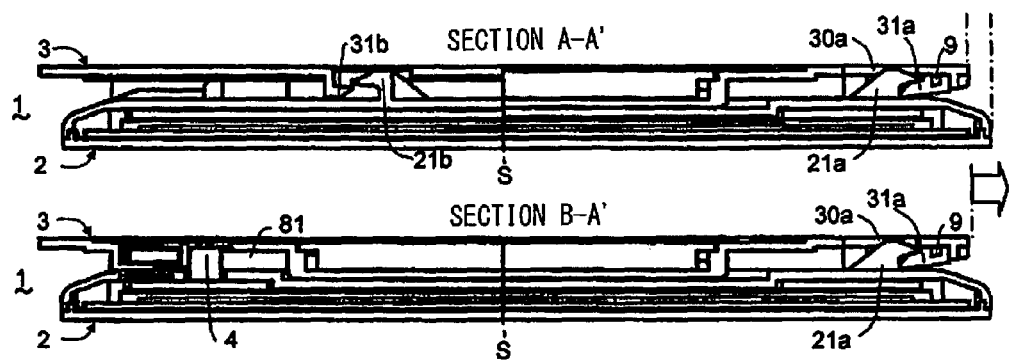
Figure 12C:
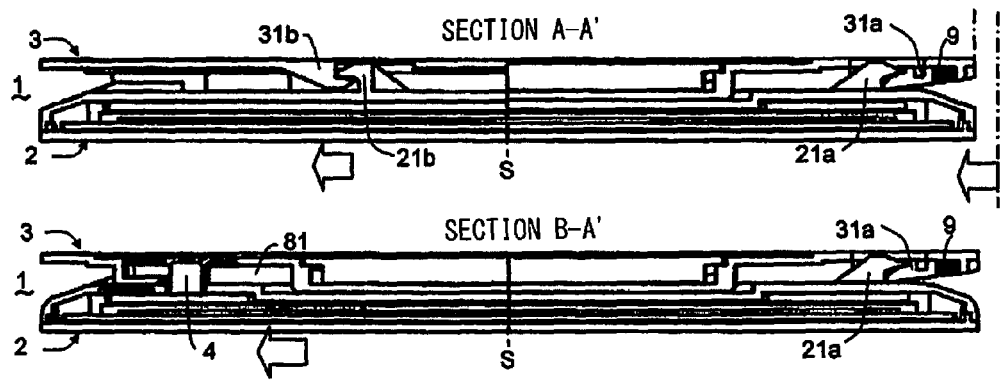

An operational procedure for replacing the light source unit 2 of the lighting apparatus 1 is explained with reference to FIGS. 11 and 12A-12C. The A-A' line of FIG. 11 is a line that goes through an attaching part 21b, an attached part 31b, an engaging part 21a and an engaged part 31a. The B-A' line of FIG. 11 is a line that goes through a terminal 4, a terminal support 81, the engaging part 21a and the engaged part 31a. FIGS. 12A-12C illustrate cross sectional views along line A-A' and B-A'. When installing the lighting apparatus 1, the attachment unit 3 is fixed on a mounting face (not shown) such as a wall, a ceiling, or a housing forming a lighting fixture body in advance. As shown in FIGS. 11 and 12A, the light source unit 2 is arranged so that the terminals 4 and the terminal supports 81 are placed in an identical side and the light source unit 2 is inclined with respect to the attachment unit 3. The light source unit 2 is then moved and the engaging parts 21a of the light source unit 2 are inserted into the engaged parts 31a of the attachment unit 3. At this time, the depressions 30a are formed at the positions, facing the engaged parts 31a, of the housing 30 of the attachment unit 3, and it is accordingly possible to deeply insert the engaging parts 21a into the engaged parts 31a with the light source unit 2 inclined with respect to the attachment unit 3.

As shown in FIG. 12B, the light source unit 2 is turned around the pivot axis X so that the light source unit 2 and the attachment unit 3 shift to a parallel position from the inclined position. At this time, the light source unit 2 is turned while being slid outward by pressing the engaged parts 31a with the engaging parts 21a. As a result, the attaching parts 21b are disposed at the side of the center plane S with respect to the attached parts 31b. Preferably, the attaching parts 21b each have round-shaped surfaces in the side of the attachment unit 3 and the attached parts 31b each have round-shaped surfaces in the side of the light source unit 2. As a result, when the light source unit 2 is turned, the attaching parts 21b and the attached parts 31b slide on each other even if the attaching parts come into contact with the attached parts, so that the attaching parts 21b are smoothly disposed at the side of the center plane S with respect to the attached parts 31b.

As shown in FIG. 12C, if the engaged parts 31a are then slid to the side of the center plane S with the light source unit 2 parallel to the attachment unit 3, the light source unit 2 is slid and the attaching parts 21b are retained by the attached parts 31b. If the worker loosens pressing the engaged parts 31a through the engaging parts 21a, the light source unit 2 slides automatically while the attaching parts 21b are retained with the attached parts 31b, because the engaged parts 31a are biased to the side of the center plane S through the bias mechanisms 9. At this time, an attachment feeling which the worker receives can be improved by the action of an elastic force from the bias mechanisms 9. In this attachment, it is also possible to perform the physical attachment and electrical connection between the light source unit 2 and the attachment unit 3 at the same time because the terminals 4 are connected to the terminal supports 81. Thus, the light source unit 2 is attached to the attachment unit 3 and the attachment of the light source unit 2 is completed.

When the light source unit 2 is detached from the attachment unit 3, the engaged parts 31a are pressed by the light source unit 2 held by hand, and thereby the engaged parts 31a are slid. As a result, the light source unit 2 is slightly slid as well, and the attaching parts 21b are released from the attached parts 31b. The light source unit 2 is separated from the attachment unit 3 with the released end of the light source unit 2 held by hand, and can be thereby detached from the attachment unit 3 easily. In addition, the light source unit 2 is slightly slid as above if the worker slides the engaged parts 31a by the finger in case lighting apparatuses 1 are arranged in line; or in case lighting apparatuses 1 are arranged in a lattice pattern, by inserting a rod member into each gap. As a result, the attaching parts 21b are released from the attached parts 31b, and the light source unit 2 can be detached from the attachment unit 3.

In the lighting apparatus 1 of the embodiment, the terminals 4 protruded from the light source unit 2 and the terminal supports 81 of the attachment unit 3 function as power supply terminals. The terminals 4 and the terminal supports 81 are arranged so that electric power can be supplied only in the state that the light source unit 2 is attached to the attachment unit 3. That is, electric power can be supplied to the light source unit 2 in the state that the attachment thereof to the attachment unit 3 is completed, while the electric power can be securely cut off if the light source unit is detached from the attachment unit 3. In the configuration, the light source unit 2 can be easily attached to and detached from the attachment unit 3 because it is unnecessary to install and remove wiring or the like therebetween. In addition, electric shock can be prevented when the light source unit 2 is attached or detached.

The engaging parts 21a and the attaching parts 21b are disposed on the non-light emitting face of the light source unit 2, and the engaged parts 31a and the attached parts 31b are disposed in the attachment face of the attachment unit 3. Accordingly, they do not overlap with the side of the light-emitting face of the light source unit 2, and accordingly non-light emitting region in the light-emitting face can be reduced. It is also possible to easily replace the light source unit 2 including the light-emitting panel 5 because the light source unit 2 can be attached to and detached from the attachment unit 3 by turning the light source unit.

The wiring board storage 24 and the circuit board storage 32 are configured so that the case 20 of the light source unit 2 and the housing 30 of the attachment unit 3 are fitted into each other and the wiring board 6 and the circuit board 8 are arranged so as not to overlap with each other. In this configuration, both the wiring board 6 and the circuit board 8 are disposed in the side of the non-light emitting face of the light-emitting panel 5 in the attachment state of the light source unit 2 to the attachment unit 3, and accordingly the non-light emitting region in the side of the light emitting face thereof can be reduced. Therefore, even when lighting apparatuses 1 are arranged side by side, their light-emitting panels 5 can be arranged to be adjacent to each other, thereby assembling a lighting system having a large light-emitting surface area. In addition, since the wiring board 6 and the circuit board 8 are disposed not so as to overlap with each other, it is possible to thin a thickness of the lighting apparatus 1 as compared with the case that they overlap with each other.

In the lighting apparatus 1, the light source unit 2 having the light-emitting panel 5 and the attachment unit 3 having the circuit board 8 have different bodies from each other. Accordingly, a user can replace the only light source unit 2 when a lighting failure occurs, such as a malfunction of the light-emitting panel 5, the end of a device's life or the like.

In a modified example of the embodiment, the terminals 4 of the light source unit 2 may be built in the attaching parts 21b, and the terminal supports 81 of the attachment unit 3 can be built in the attached parts 31b. That is, the terminals 4 are connected with the terminal supports 81 with the attaching parts 21b retained by the attached parts 31b. In this modified example, it is possible to perform the physical attachment and electrical connection between the light source unit 2 and the attachment unit 3 at the same time, like the aforementioned embodiment. There is a case where the light source units 2 are distributed as single replacement members. In this distribution, the terminals 4 protruded from the light source unit 2 need to be protected in order to prevent bent damage or the like. In this modified example, since the terminals 4 are built in the attaching parts 21b that are structural members, it is possible to protect the terminals 4 without using additional protect member or the like. The attaching parts 21b and the attached parts 31b may be formed of conductive materials and configured so that they function as power supply terminals. As a result, parts count can be reduced.

Third Embodiment

Figure 13A:
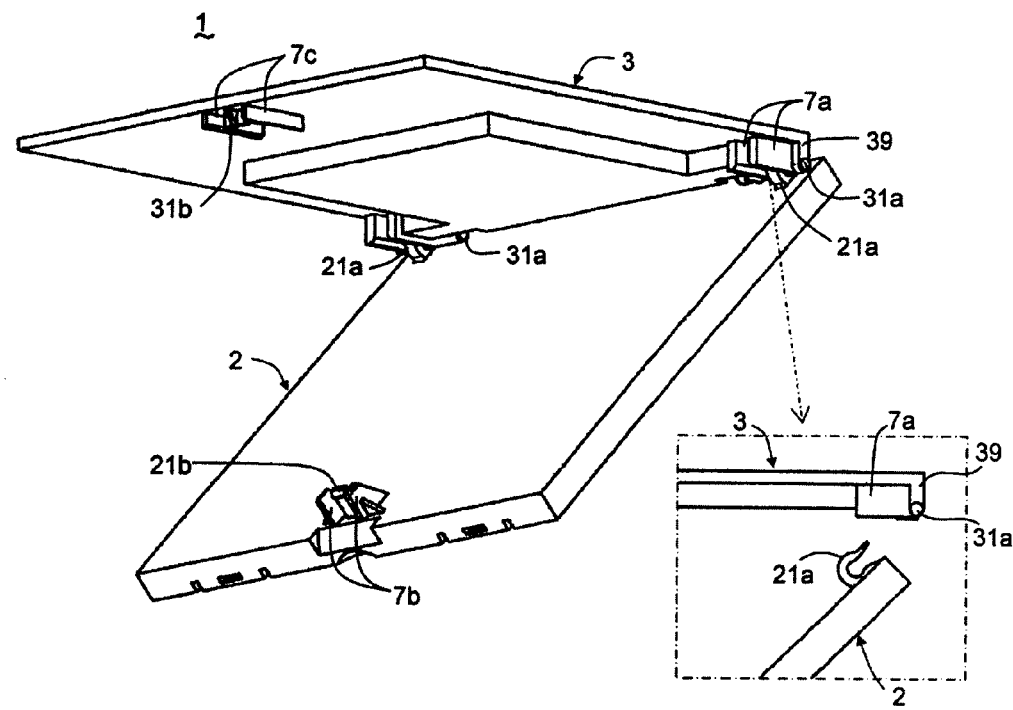
FIG. 13A is a perspective view showing that a light source unit is free to turn with respect to an attachment unit in the lighting apparatus in accordance with a third embodiment of the present invention.

A lighting apparatus in accordance with a third embodiment of the present invention is explained with reference to FIGS. 13A and 13B. In a lighting apparatus 1 of the embodiment, each engaging part 21a of a light source unit 2 is formed of a U-shaped hook member, and each engaged part 31a of an attachment unit 3 forms an axis member. That is, the U-shaped engaging parts 21a hang on the engaged parts 31a as axes, and thereby the light source unit 2 is free to turn around a pivot axis of the engaged parts 31a with respect to the attachment unit 3. In the example, the engaging parts 21a are disposed at both ends of one side of the light source unit 2, and the engaged parts 31a are disposed at both ends of one side of the attachment unit 3. An attaching part 21b is disposed at an opposite side to the side at which the engaging parts 21a are disposed, and an attached part 31b is disposed at an opposite side to the side at which the engaged parts 31a are disposed. In the example, they are disposed one each at center parts of the aforementioned sides of the light source unit 2 and the attachment unit 3.

Each engaging part 21a has a prescribed hardness and is formed of metallic material having conductivity. Each engaging part 21a is formed so that an interval between both ends of the U-shape is larger than each diameter of the engaged parts 31a as axes members. One end of each U-shaped engaging part 21a is fixed to the light source unit 2 and also electrically connected to a wiring board (not shown) stored in the light source unit 2. Preferably, each engaging part 21a is shaped like a U-shaped arc of which intermediate part is 180° or more. The engaging parts 21a can be hard to come off the engaged parts 31a if a turned angle of the light source unit 2 with respect to the attachment unit 3 is in a prescribed range. As shown in an enlarged view of FIG. 13A, other end of each U-shaped engaging part 21a is slightly bent to an opposite side to the U-shaped arc, and thereby easy to hang on and take off an engaged part 31a as an axis.

Each engaged part 31a is formed of metallic material having prescribed hardness and conductivity. Each engaged part 31a is also supported by a pair of bearing pieces 39 protruded from the attachment unit 3 to a side of the light source unit 2. A wire (not shown) is built in the bearing pieces 39, and is adapted to electrically connect the engaged part 31a with a circuit board (not shown) stored in the attachment unit 3. Accordingly, if the engaging parts 21a engage with the engaged parts 31a, the light source unit 2 is electrically connected with the attachment unit 3. A pair of separation members 7a are disposed inside the bearing pieces 39, and adapted to keep a distance and a turning angle between the light source unit 2 and the attachment unit 3 at constant levels.

Figure 13B:
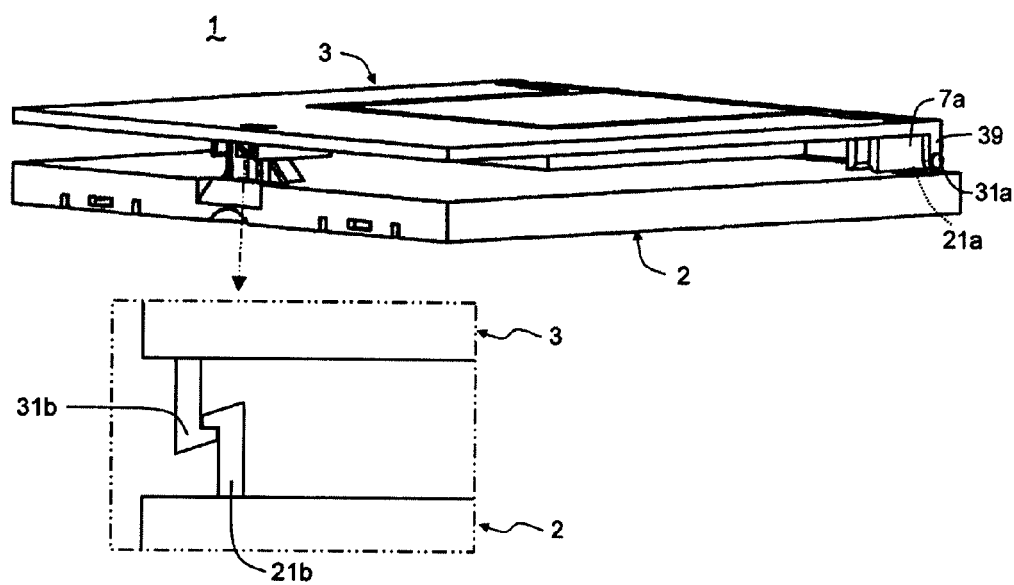
FIG. 13B is a perspective view of the light source unit and the attachment unit with the light source unit attached to the attachment unit.

As shown in an enlarged view of FIG. 13B, the attaching part 21b and the attached part 31b are each L-shaped plate members, and their bent tips engage with each other and thereby the light source unit 2 can be retained by the attachment unit 3. At least one of the attaching part 21b and the attached part 31b is formed of material having flexibility, and either of them is elastically deformed and a tip of one of them is fit to a bent part of the other, thereby establishing engagement. Like the bearing pieces 39, a pair of separation members 7b is disposed outside the attaching part 21b and a pair of separation members 7c is disposed outside the attached part 31b, which are adapted to keep a distance and a turning angle between the light source unit 2 and the attachment unit 3 at constant levels. In the example, the separation members 7b of the light source unit 2 are disposed inside the separation members 7c of the attachment unit 3, and the separation members 7c are disposed outside the separation members 7b, thereby preventing collision of the separation members 7b and the separation members 7c.

In the embodiment, a mechanical coupling of the light source unit 2 and the attachment unit 3, and an electrical connection therebetween can be realized with a simple configuration. It is therefore possible to reduce parts count and improve productivity of the lighting apparatus 1.

Figure 14:
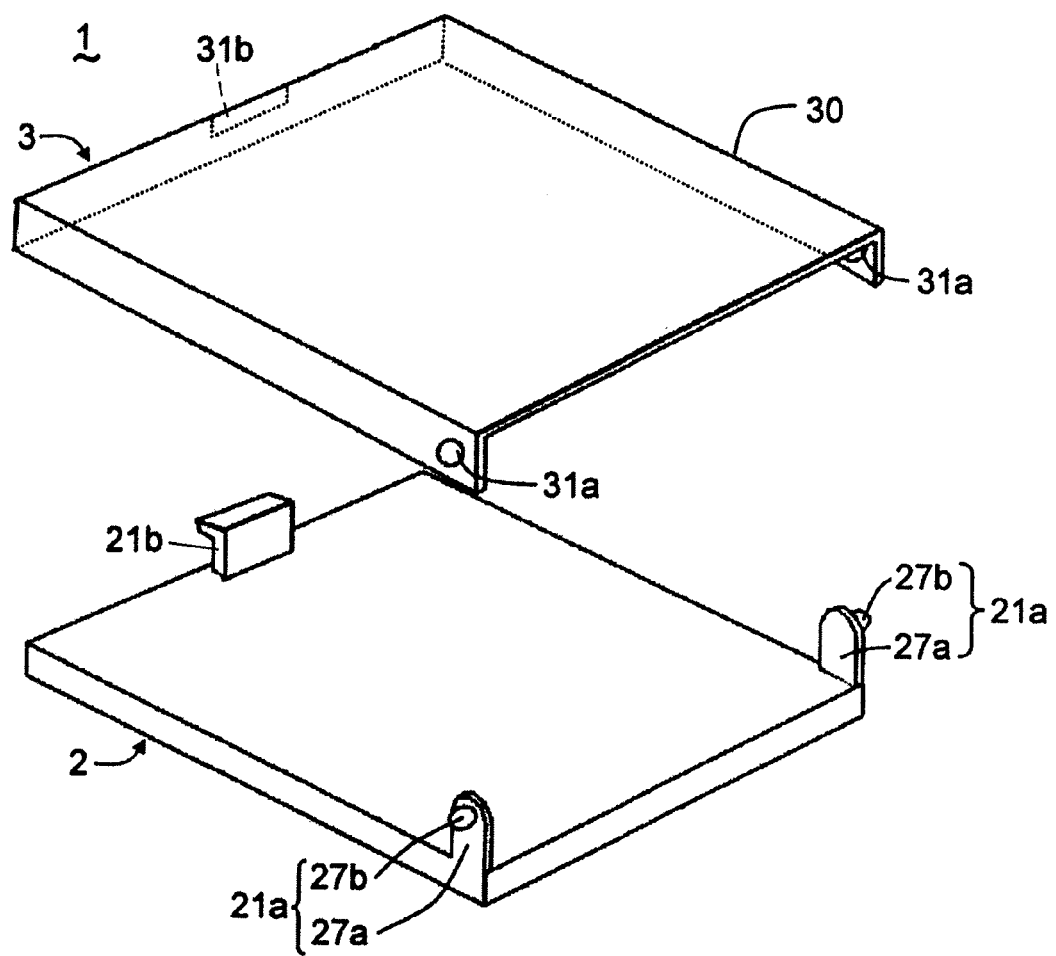
FIG. 14 is an exploded perspective view of a modified example of the embodiment.

Modified examples of the embodiment are explained with reference to FIGS. 14 and 15. In a modified example shown in FIG. 14, a plurality of (two) engaging parts 21a in a light source unit 2 is formed of upright pieces 27a that extend upright to a side of an attachment unit 3; and convex parts 27b disposed on outer faces of the upright pieces. A plurality of (two) engaged parts 31a in the attachment unit 3 is formed of holes disposed in sides of a housing 30 of the attachment unit 3. The upright pieces 27a are formed of members having flexibility. If the convex parts 27b of the engaging parts 21a are fit in the holes of the engaged parts 31a, the engaging parts 21a engage with the engaged parts 31a, and the light source unit 2 is free to turn with respect to the attachment unit 3. An attaching part 21b is formed of an L-shaped plate member like the aforementioned embodiment. An attached part 31b is formed of a groove disposed in a side of the housing 30 of the attachment unit 3. In this configuration, if a bent tip of the attaching part 21b is fit in the groove of the attached part 31b, the attaching part 21b engages with the attached part 31b and the light source unit 2 is mechanically retained by the attachment unit 3.

Figure 15:
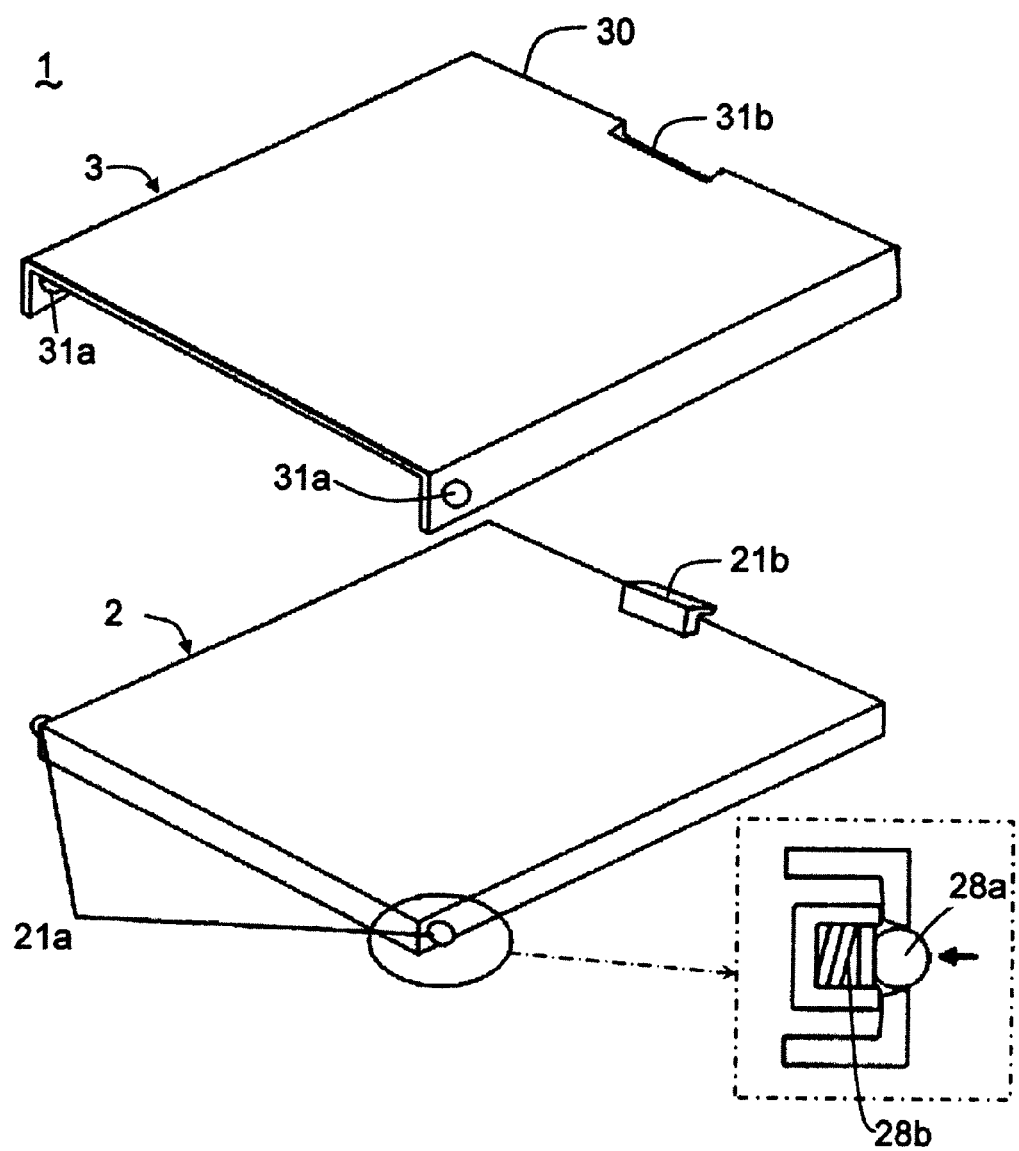
FIG. 15 is an exploded perspective view of another modified example of the embodiment.

In a modified example shown in FIG. 15, a plurality of (two) attaching parts 21a in a light source unit 2 is formed of convex parts 28a that are disposed in sides of a case 20 in the light source unit 2 and free to move outward and inward. A plurality of (two) engaged parts 31a in an attachment unit 3 is formed of holes disposed in sides of a housing 30 of the attachment unit 3. The convex parts 28a are biased by springs 28b to protrude from the case 20. In the example, inner peripheral sides of the housing 30 are larger than outer peripheral sides of the case 20. In this configuration, if the convex parts 28a of the attaching parts 21a are fit in the holes of the engaged parts 31a, the attaching parts 21a engage with the engaged parts 31a and the light source unit 2 is free to turn with respect to the attachment unit 3. An attaching part 21b and an attached part 31b are configured like the aforementioned modified example. If a bent tip of the attaching part 21b is fit in a groove of the attached part 31b, the attaching part 21b engages with the attached part 31b and the light source unit 2 is mechanically retained by the attachment unit 3. In the modified examples, a mechanical coupling of the light source unit 2 and the attachment unit 3, and an electrical connection therebetween can be realized with a simpler configuration.

In the present invention, numerous modifications can be made as long as an engaging part 21a engages with an engaged part 31a and thereby a light source unit 2 is free to turn with respect to an attachment unit 3, and they are attached with an attaching part 21b and an attached part 31b. For example, in the aforementioned embodiment, the engaged parts 31a are free to slide, but the engaging parts 21a may be free to slide.

The invention claimed is:
1. A lighting apparatus, comprising:
a light source unit that has a case storing therein a planar light-emitting panel and a wiring board mounted on a non-light emitting face of the light-emitting panel; and
an attachment unit that has a housing storing therein a circuit board configured to control lighting of the light-emitting panel, said attachment unit being configured to be attached to and detached from a back of the light source unit,
wherein the case is formed of a front case covering a side of a light-emitting face of the light-emitting panel, and a single rear case covering a side of the non-light emitting face, the single rear case of the case integrally has a recess on a side of the attachment unit and on the side of the non-light emitting face of the light-emitting panel, and part of the single rear case, on a position that is different from a position of the recess, facing the attachment unit is shaped like a convex, and the part of the single rear case shaped like the convex forms a concave wiring board storage storing therein the wiring board, the concave wiring board storage being directly formed at a back of the single rear case,
wherein a side of the housing, facing the light source unit is shaped like a convex, and a concave circuit board storage storing therein the circuit board is formed at a back side of the housing,
wherein the case of the light source unit and the housing of the attachment unit are configured so that, in an attachment state of the back of the light source unit to the attachment unit, a whole of the wiring board storage and a whole of the circuit board storage are arranged at different positions in a direction perpendicular to an attachment direction of the back of the light source unit to the attachment unit, and so that part, corresponding to the circuit board storage, of the housing is fitted into the recess of the case.
2. The lighting apparatus of claim 1, wherein a recess formed of part, which is different from the wiring board storage, of the case, and the circuit board storage shaped like a convex in the side of the housing facing the light source unit are formed at positions corresponding to each other and engaged with each other by a tongue-and-groove joint.

3. The lighting apparatus of claim 2, wherein the wiring board is shaped like a frame and the circuit board is disposed at a center of the attachment unit so as to correspond to a central opening of the frame-shaped wiring board.

4. The lighting apparatus of claim 1,
wherein an engaging part is provided at one end of the non-light emitting face of the light source unit and an engaged part configured to be engaged with the engaging part is provided in an attachment face, to which the light source unit is attached, of the attachment unit,
wherein in a state that the engaging part engages with the engaged part, the light source unit is free to turn with respect to the attachment unit, and
wherein an attaching part is provided at different part from one end, at which the engaging part is provided, of a non-light emitting face of the light source unit, and an attached part at which the attaching part is configured to be retained is provided in the attachment face of the attachment unit.

5. The lighting apparatus of claim 4, wherein the attaching part and the attached part are provided at other side different from the engaging part and the engaged part with respect to a center plane passing through a center part of the light source unit, said center plane including a normal line to said attachment face and a line parallel to a pivot axis around which the light source unit is free to turn with respect to the attachment unit.

6. The lighting apparatus of claim 4, wherein the engaging part or the engaged part is free to slide in a direction substantially parallel to said attachment face and elastically biased in a direction from one end to center side thereof.

7. The lighting apparatus of claim 4, wherein the engaging part and the engaged part as well as the attaching part and the attached part are formed so that the engaging part and the engaged part are different, in width along a direction of a pivot axis, from the attaching part and the attached part.

8. The lighting apparatus of claim 4, wherein the engaging part and the engaged part as well as the attaching part and the attached part are provided one pair each, and configured so that each interval of the pair of the engaging parts and the pair of the engaged parts differs from each interval of the pair of the attaching parts and the pair of the attached parts.

9. The lighting apparatus of claim 4, wherein the light source unit and the attachment unit comprise respective power supply terminals, the power supply terminals being located at positions apart from the engaging part and the engaged part.

10. The lighting apparatus of claim 4, wherein the attaching part and the attached part are configured to function as power supply terminals.

11. The lighting apparatus of claim 4, wherein the engaging part and the engaged part are configured to function as power supply terminals.

12. The lighting apparatus of claim 5, wherein the engaging part or the engaged part is free to slide in a direction substantially parallel to said attachment face and elastically biased in a direction from one end to center side thereof.

13. The lighting apparatus of claim 5, wherein the engaging part and the engaged part as well as the attaching part and the attached part are formed so that the engaging part and the engaged part are different, in width along a direction of said pivot axis, from the attaching part and the attached part.

14. The lighting apparatus of claim 5, wherein the engaging part and the engaged part as well as the attaching part and the attached part are provided one pair each, and configured so that each interval of the pair of the engaging parts and the pair of the engaged parts differs from each interval of the pair of the attaching parts and the pair of the attached parts.

15. The lighting apparatus of claim 5, wherein the light source unit and the attachment unit comprise respective power supply terminals, the power supply terminals being located at positions apart from the engaging part and the engaged part.

16. The lighting apparatus of claim 5, wherein the attaching part and the attached part are configured to function as power supply terminals.

17. The lighting apparatus of claim 5, wherein the engaging part and the engaged part are configured to function as power supply terminals.

18. The lighting apparatus of claim 1, wherein the circuit board in the circuit board storage is separated from the wiring board in the wiring board storage by the case and the housing.

* * * * *